United States Patent [19]

Duncan

[11] Patent Number: 4,963,866

[45] Date of Patent: Oct. 16, 1990

[54] MULTI CHANNEL DIGITAL RANDOM ACCESS RECORDER-PLAYER

[75] Inventor: Virgil D. Duncan, Raleigh, N.C.

[73] Assignee: Digital Recorders, Inc., Research Triangle Park, N.C.

[21] Appl. No.: 328,863

[22] Filed: Mar. 27, 1989

[51] Int. Cl.[5] .............................................. H03M 3/00
[52] U.S. Cl. .................................. 341/110; 341/123; 360/32; 365/45
[58] Field of Search ............... 341/108, 110, 122, 123, 341/126, 138, 141, 143, 144, 155; 360/32; 364/825; 365/45

[56] References Cited

U.S. PATENT DOCUMENTS

| | | | |
|---|---|---|---|
| 4,626,827 | 12/1986 | Kitamura et al. | 341/123 |
| 4,673,916 | 6/1987 | Kitamura et al. | 341/110 |
| 4,763,207 | 8/1988 | Podolak et al. | 341/123 |
| 4,772,873 | 9/1988 | Duncan | 341/110 |
| 4,813,014 | 3/1989 | De Bell | 365/42 |

Primary Examiner—William M. Shoop, Jr.
Assistant Examiner—Howard L. Williams
Attorney, Agent, or Firm—Richard E. Jenkins

[57] ABSTRACT

A multi-channel digital random access recorder-player receives an analog audio signal, converts the audio signal into a digital signal, and stores the digital signal in a memory for random access. The memory includes sixteen channels, each channel having sixteen memory boards, each channel and each memory board being assigned a unique four bit binary address by an address counter. An external control is provided by which the user selects an address for recording or playback and a comparator compares the selected address with the addresses of the memory. When the memory address corresponding to the selected address is detected, that memory board is enabled so that data can be recorded on the memory board or retrieved from the memory board for playback through an audio output device such as a loudspeaker. The recorder-player thereby provides random access to a memory. Also provided is a system in which several modules, each with a logic board and a memory, are combined into a single system.

17 Claims, 3 Drawing Sheets

ONE LOGIC BOARD COULD CONTROL UP TO 256 MEMORY BOARDS, ORGANIZED INTO UP TO 16 CHANNELS WITH UP TO 16 BOARDS PER CHANNEL. ALL IN A SINGLE MODULE.

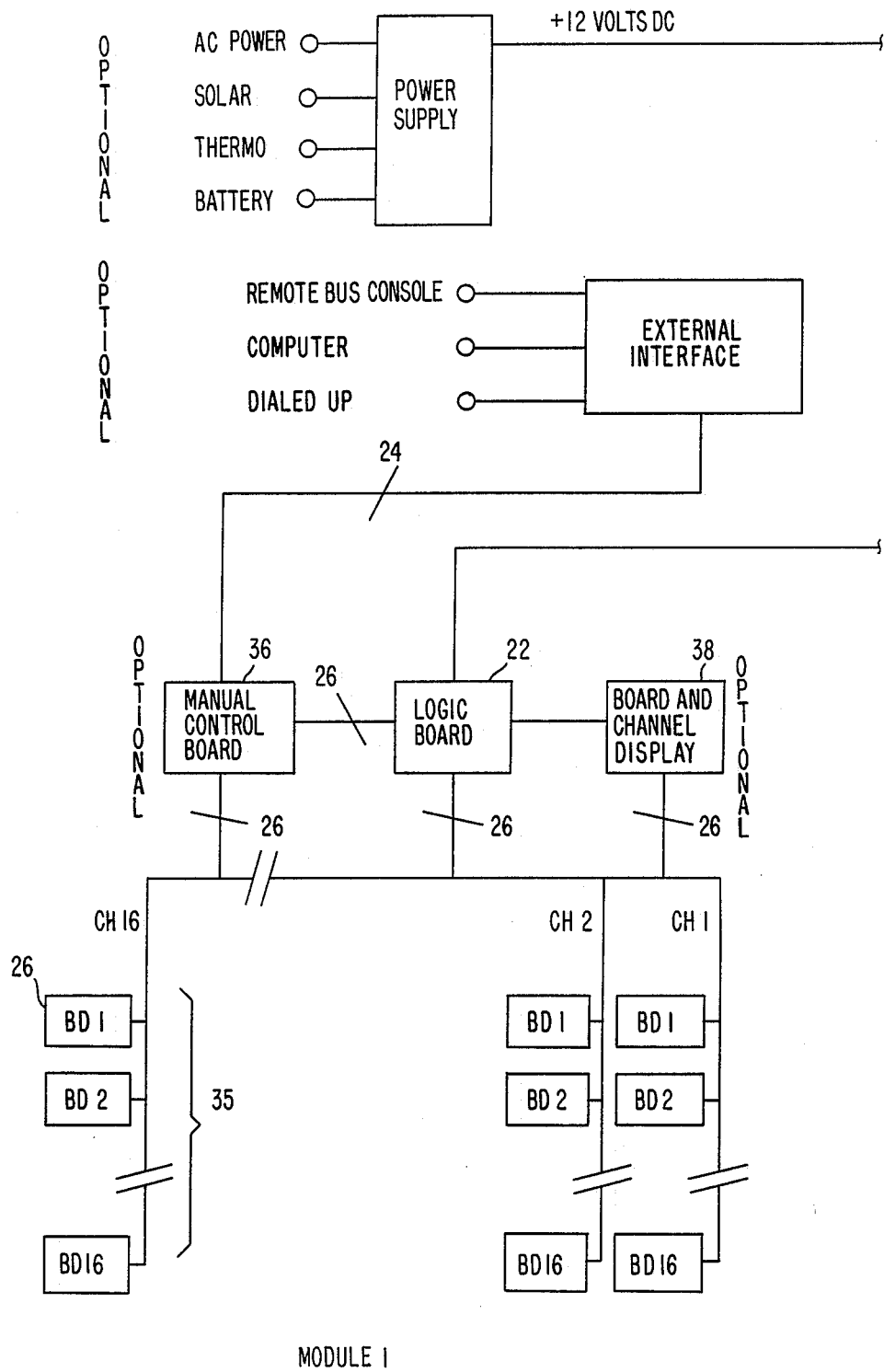

MODULE 4

256K CHIPS (262,144 BITS)

| BANDWIDTH | CHIP | BOARD | CHANNEL | MODULE | 4 MODULES | DIVIDER | FREQ.OUT | CUSD FREQ. |
|---|---|---|---|---|---|---|---|---|
| 2.5 KHZ | 16.4S | 2M 11S | 34M 56S | 7H 18M 56S | 37H 15M 44S | 28 | 127.8 KHZ | 15.960 HZ |
| 3.5 KHZ | 11.7S | 1M 33S | 22M 48S | 6H 4M 48S | 24H 19M 12S | 20 | 178.9 KHZ | 22.372 HZ |
| 5.0 KHZ | 8.2S | 1M 5S | 17M 22S | 4H 37M 20S | 18H 29M 20S | 14 | 255.6 KHZ | 31.960 HZ |
| 7.5 KHZ | 5.2S | 41.6S | 11M 5S | 2H 57M 20S | 11H 49M 20S | 9 | 397.7 KHZ | 49.715 HZ |
| 10.0 KHZ | 4.1S | 32.8S | 8M 44S | 2H 1HM 57S | 8H 43M 48S | 7 | 511.3 KHZ | 63.920 HZ |

MEMORY BOARDS:

THERE ARE 16 BOARDS IN EACH CHANNEL
THERE ARE 256 BOARDS IN ONE MODULE
THERE ARE 1024 BOARDS IN 4 MODULES

FOR 8 MEMORY CHIPS PER BOARD:

THERE ARE 128 CHIPS PER CHANNEL
THERE ARE 2048 CHIPS PER MODULE
THERE ARE 8192 CHIPS IN 4 MODULES

MULTI CHANNEL DIGITAL RANDOM ACCESS RECORDER-PLAYER

BACKGROUND AND SUMMARY

1. Technical Field

The present invention relates generally to the field of audio recording and playback systems. More particularly, it relates to the field of digital audio recording and playback systems.

2. Background Art

Typical audio recording systems known in the art use magnetic tape, drums or disks as storage media for storing audio signals for later playback. An audio sensor or detects analog audio signals which are converted to electronic pulses. The storage medium typically is mechanically rotated to expose an unwritten section thereof to an electronic unit which records the incoming signal on the medium.

Such systems suffer from various disadvantages. For example, the mechanical parts of the system may wear, especially those parts which rotate or otherwise move. The media themselves may be damaged in normal use, as when a tape is stretched or a disk is scratched, thereby decreasing the quality of the recording and playback. Moreover, the mechanical parts of those systems usually require periodic maintenance or replacement. Such systems also suffer from a limitation on the ability of the user to select randomly a portion of the recording to be played. That is, the messages must be accessed serially, as, for example, by rewinding the recording tape. And the portion of the recording desired may be difficult to locate readily, resulting in excessive search and effort.

3. Summary of the Invention

The present invention is an improvement of the digital recorder/player of U.S. Pat. No. 4,772,873 to the present inventor, which is incorporated herein by reference. The present invention is a modular system for digital random access recording and playback of audio signals. A single module may comprise one logic board, and up to sixteen channels. Each of the channels may have up to sixteen memory boards per channel. A power supply and interconnect cables also are provided. An entire system may comprise several modules. In a system with four modules, for example, there could be four independent audio sources, a crystal controlled master oscillator to provide uniform clocking to the modules, four logic boards, up to 1,024 memory boards, a power supply and interconnect cables. A timer may also be provided for timed random access recording and playback.

Preferably, according to the present invention, an audio signal is picked up and filtered by an analog filter which blocks DC and very low frequencies. Then the signal is filtered by digital filters to prevent foldover distortion of the analog audio signal. One of the digital filters also preferably generates a clock, although it can be slaved to an external clock. The other filters and an analog to digital/digital to analog converter (ADC/DAC) are slaved to the digital filter clock to prevent harmonic heterodyning. A master oscillator may be provided in a system incorporating multiple modules.

Preferably, the ADC/DAC is a continuous variable slope delta (CVSD) modulator system which samples the analog audio signal at a uniform frequency. The digital signal output of the ADC is fed to a memory board. The clocking for the CVSD and for the logic board is derived, through a divide-by-eight counter, from the digital filter clock. The logic board controls one module of the system and serves as the controller for the memory boards, an encoder for analog to digital conversion, a decoder for digital to analog conversion, an interface for the system and module controls, and provides clocking for each individual module.

The memory of each module of the system of the present invention preferably includes up to sixteen channels, each having up to sixteen memory boards. The memory technology may include CMOS static RAMs, EPROMs or EEPROMs. To accomplish random accessing, each of the channels is addressed by a unique four bit binary code and each of the memory boards is addressed by a unique four bit binary code. Thus, a complete address for a particular memory board of a particular channel is an eight bit code including the unique channel code and the unique board code. Each board of a particular channel will have the same four bits of channel code and a different four bit board code.

The logic board communicates with the memory of the system via a memory buss which includes a 34 line edge pin connector which connects with all memory boards of the module. The logic board includes a "D" flip-flop to define the reset and play modes. When power is first applied to the logic board, the logic board resets. Random access for the recording and play modes is achieved by each memory board using two four bit comparators, one which compares the four bit channel code on the memory buss with the setting of a four bit switch, and one which compares the four bit board code on the buss with the four bit switch on the memory board itself. An external control switch selects the record or play mode and selects a channel and memory board to receive recorded data or from which data are played back. When there is a match of codes, the memory control logic on an individual memory board is enabled and data is written to or retrieved from a particular memory board.

The logic board is also provided with channel and memory board counters for the sequential use of the channels and memory boards in a module. That is, the first memory board of the first channel is filled with messages first, then the second memory board of the first channel, and so on through the sixteenth memory board of the first channel. Then the second channel is enabled, and each of its memory boards is filled sequentially. The process continues until all 256 memory boards of the sixteen channels are filled. Alternatively, the present invention provides for external control of the channel and memory board selection to provide random access to the memory.

During the record cycle, a selected memory chip is enabled to read incoming data, and data are passed in serial format from the logic board to the selected memory board to be converted to parallel format by a serial to parallel converter, and data are strobed into memory.

During the playback cycle, the control logic on the memory board selects a memory chip, the data corresponding to an address supplied by address counters. The data are converted from parallel to serial format by a converter and are transmitted back to the logic board for conversion from digital to analog signals. The analog signal is filtered and amplified before passing to an audio signal output device such as a loudspeaker.

By providing for digitalization of an audio signal and storage of the signal in digital form in a memory and by providing for random access of the signals so stored, the present invention overcomes disadvantages and limitations of audio recording systems of the past.

Accordingly, it is a primary object of the present invention to provide an audio recording and playback system which converts an audio signal to digital form and stores the digital signal in a memory such that random access for recording and playback is achieved.

It is another object of the present invention to provide a digital audio recording and playback system with a memory unit having a plurality of channels, each channel having a plurality of memory boards, and in which channels and memory boards can be randomly accessed.

These and other objects, features and advantages of the present invention are described in or are apparent from the following detailed description of a preferred embodiment.

BRIEF DESCRIPTION OF THE DRAWINGS

The preferred embodiment will be described with reference to the drawings, in which.

DETAILED DESCRIPTION OF THE PREFERRED EMBODIMENT

Figure 1:
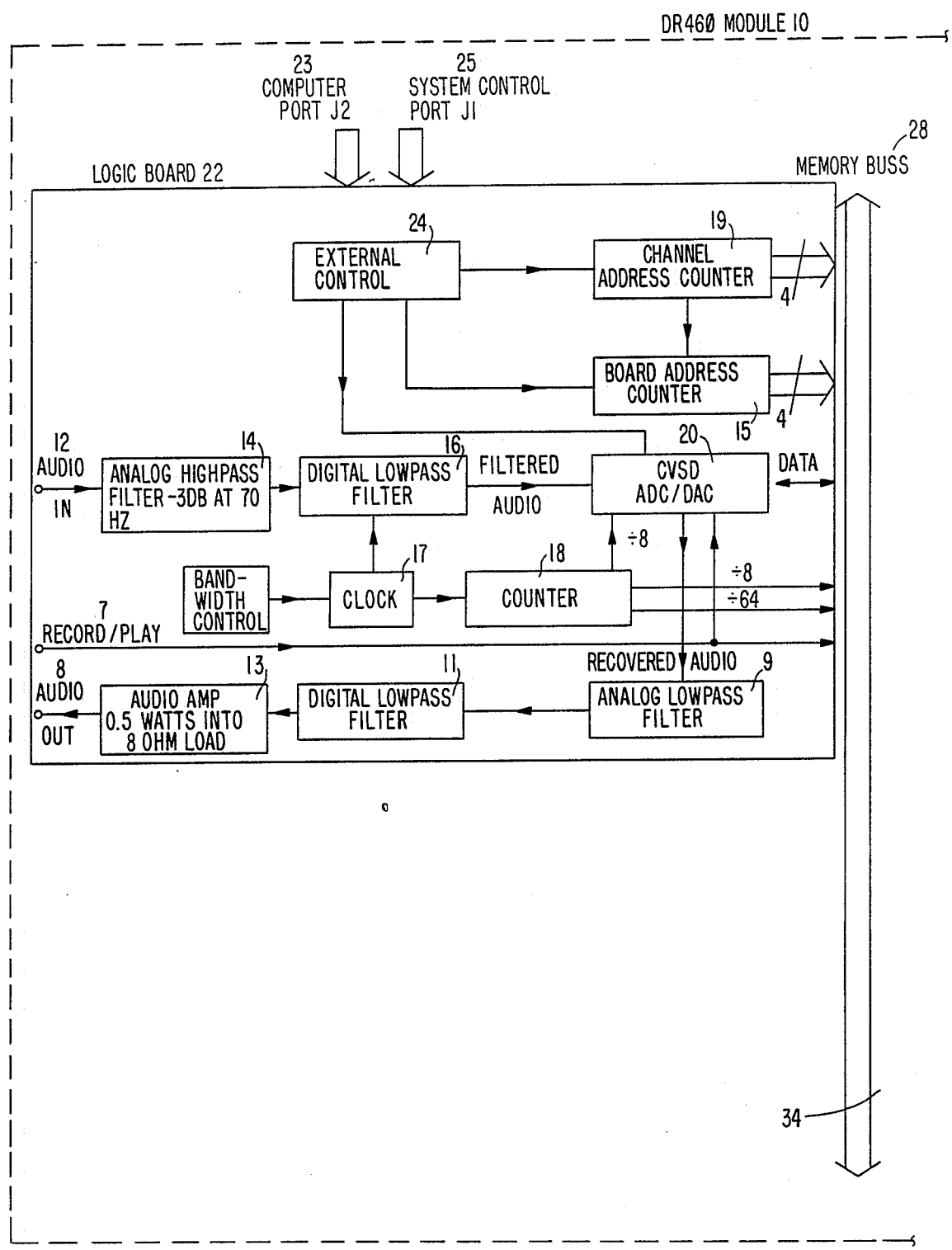
FIG. 1 is a block diagram generally showing the relationships of the main components of one module of a digital audio recording and playback system constructed in accordance with the present invention.

Referring to FIG. 1, a block diagram of the relationships of the main components of a preferred embodiment of one module 11 of a multi-channel digital random access recorder-player 10 of the present invention is shown. The particular subcomponents of each main component shown in FIG. 1 will be discussed in more detail below. Generally, FIG. 1 shows a signal processor, including an analog filter 14, a digital filter 16, an ADC/DAC 20, a counter 18 and a clock 17, coupled to a module which includes a logic board 22, an external control 24, a memory buss 28, and a memory board 26. Memory board 26 includes channel code comparator 25, board code comparator 27, serial-to-parallel/ parallel-to-serial converter 29, memory storage chips 32, memory manager 30 and back-up battery 31.

An analog signal input 12 is filtered by an analog filter system 14 for blocking DC and very low frequencies and by a digital filter 16. Circuit 16 digitally filters the input signal to prevent foldover distortion of the analog signal during sampling. A clock 17 generates a clock signal which is used by the entire system. As shown, the single clock signal from clock circuit 17 is a part of digital filter 16, and is divided by counter 18 to provide the correct timing for the other components of the system, as described more fully below.

The output signal from digital filter 16 is converted from analog to digital by analog-to-digital/digital-to-analog converter (ADC/DAC) 20, which preferably is a continuous variable slope delta (CVSD) modulator system, the sampling rate of which is set by the output of counter 18.

The output of ADC/DAC 20 is fed from logic board 22 which serves as the controller for a memory unit 26 and as an interface with an external control 24, as well as the rest of the system. The clocking for memory board 26 also is provided by digital filter and clock circuit 17 via counter 18. Logic board 22 communicates with memory unit 26 via a memory buss 28 which includes a 34 line edge pin connector.

Memory unit 26 may include up to sixteen channels, each of the channels having up to sixteen memory boards 26. FIG. 1 shows only two representative channels and one representative memory board 26 for each channel. Each memory board 26 is assigned a unique address and data from logic board 22 may be recorded in memory by sequential filling of each memory board of each channel, if desired. That is, a first memory board 26 of a first channel is filled with data, then the second memory board 26 of the first channel is filled with data, and so on until all memory boards of the first channel are filled. Then, data are entered in the first memory board 26 of the second channel, and so on in sequence. Data may be retrieved in the same sequential manner if desired.

Each module 11 of recorder-player 10 provides random access, both for recording and playback modes when sequential recording and playback is not desired. In random access recording, the record mode is selected by the user or by an external control 24, and the correct four bit board and channel codes are strobed in through external control 24 to preset the channel address counter and memory board address counter to the desired channel and board number. The selected addresses are placed on memory buss 28 and are fed into two comparators 25 and 27 on memory board 26. Comparator 25 compares the four bit channel address present on memory buss 28 with the channel addresses set by four bit switch 21 on memory board 26 and comparator 27 compares the four bit board address present on memory 28 with the four bit switch 33 on memory board 26. When the addresses present on memory buss 28 match the addresses on memory board 26, then the board and channel comparators 25, 27 enable the memory management unit 30 and the address counter 34. Data from logic board 22 may then be written to the memory board 26 with the matching board and address code.

In a similar manner, random access playback is achieved by the digital recorder-player 10 of the present invention. The user, by manual or automatic selection, sets a mode switch on external control 24 to playback position and strobes the correct address through the computer port 23 to the external control 24 to select the desired channel and board number. The address selection at external control 24 is compared by comparators 25 and 27 with the addresses of the channel and board address counters 19 and 15 on the logic unit 22. When a match between the addresses is found, comparators 25 and 27 enable the selected memory board 26 to read and place data in a serial format on memory buss 28 to logic board 22.

An analog audio input signal 12 is converted to digital by ADC/DAC 20 in the record mode. In playback mode, the digital data bits from memory unit 26 are converted back to the original audio program by ADC-/DAC 20.

As noted above, the many types of A to D and D to A converters or processes, the present invention preferably includes the continuous - variable - slope - delta modulator system, called CVSD. This system design relies on the delta modulation technique.

In a CVSD modulator, a reference waveform, resulting from integrating three output bits, is subtracted from the sampled input waveform. Each output is one bit per sample. If the difference is a positive quantity, the output bit of the next sample will be a "1"; if the difference is negative, the output bit of the next sample will be a "0". This reference waveform, therefore, moves positively or negatively by one increment or by one step with each sample. The reference waveform is set to zero by initializing the integrators to zero before each message is played or recorded.

This technique can reduce or even reverse the polarity of the difference between two steps or samples. The modulator now becomes a negative feedback system with output bits which allow the reference waveform to follow the input signal. Delta modulation is a special case of differential PCM (Pulse Code Modulation), with only one bit per sample and the output bit rate equal to the sampling frequency. CVSD is a particular type of adaptive delta-modulation.

CVSD requires no precision components and can be manufactured economically. As all bits have equal weight, isolated bit errors have a very minor audible effect. When combined with the commanding properties of CVSD, differential coding more closely matches the properties of human hearing.

In the CVSD system, overloads of short duration have a minor audible effect and/or may even be undetectable. The CVSD system can recover from dynamic audio overload in one to three cycles. However, there is no absolute audio signal value, but only the change in signal value from sample to sample. To overcome this problem, the CVSD system of the present invention always starts recording at zero value and all playbacks start at zero value. This provides excellent agreement with absolute audio signal value.

Due to the dynamics of CVSD digital audio recording, conventional sine wave testing is not necessarily a true indication of the audio quality. A form of dynamic testing should be employed.

In performing the A to D conversion, samples of the analog audio signal 12 are taken at a uniform frequency. Thus, sampled data systems require the output signal to be band limited. This applies to audio. This sampling has been defined by the Nyquist Theorem, Shannon and others. The Nyquist theorem derivation assumes a sinusoidal input and employs trigonometric identities to reach a conclusion. For dynamic audio signals, the sampling frequency must be higher than the Nyquist frequency to obtain a representative signal.

To control the bandwidth and perform band limiting, digital filters are used. In the past, fixed passive devices or fixed active filters were used. If changes were made in the sampling frequency or in the bandwidth, it was necessary to do a complete new design and to change the components. With digital filters, the only change required is the clocking frequency. See U.S. Pat. No. 4,772,873.

Clocking for the digital logic board 22 and ADC-/DAC 20 advantageously is derived from the clocking frequency of clock 17. This prevents heterodyne and beat frequency interference as all of the clock frequencies are synchronized. Where fixed clock frequency is required, the clock is determined by an RC time constant or a crystal as part of clock 17. However, external clocks may be used. For a variable frequency clock, the resistor is replaced with a trimpot and the capacitor is held constant. This combination of clocking and digital filtering provides any number of audio bandwidth/playtime characteristics. Only one control is required. This digital clocking technique is covered under U.S. Pat. No. 4,772,873.

The multi-channel recorder-player of the present invention is a modular concept. A minimum configuration can be made up with one logic board 22 and one memory board 26 (with 2 megabits or 2,048 kilobits of memory) plus power supply and interconnect cable. A module can be made up with one logic board 22, and up to 16 channels. Each channel may contain up to 16 memory boards 26 per channel. A complete module would include a logic board 22, a total of 256 memory boards 26 (over 512 megabits or 524,288 kilobits of memory), plus power supply and interconnect cable. Audio bandwidth is controlled by only one simple adjustment from 2.5 kHZ to 10 kHZ. Record/play time per memory board 26 is from 2 minutes 11 seconds at 2.5 kHZ to 33 seconds at 10 kHZ. Therefore, a module will have a record/play time from 9 hours 19 minutes at 2.5 kHZ to 2 hours, 11 minutes at 10 kHZ and a 4 module system will be from 37 hours, 18 minutes at 2.5 kHZ to 9 hours, 19 minutes at 10 kHZ.

Figures 1, 2:
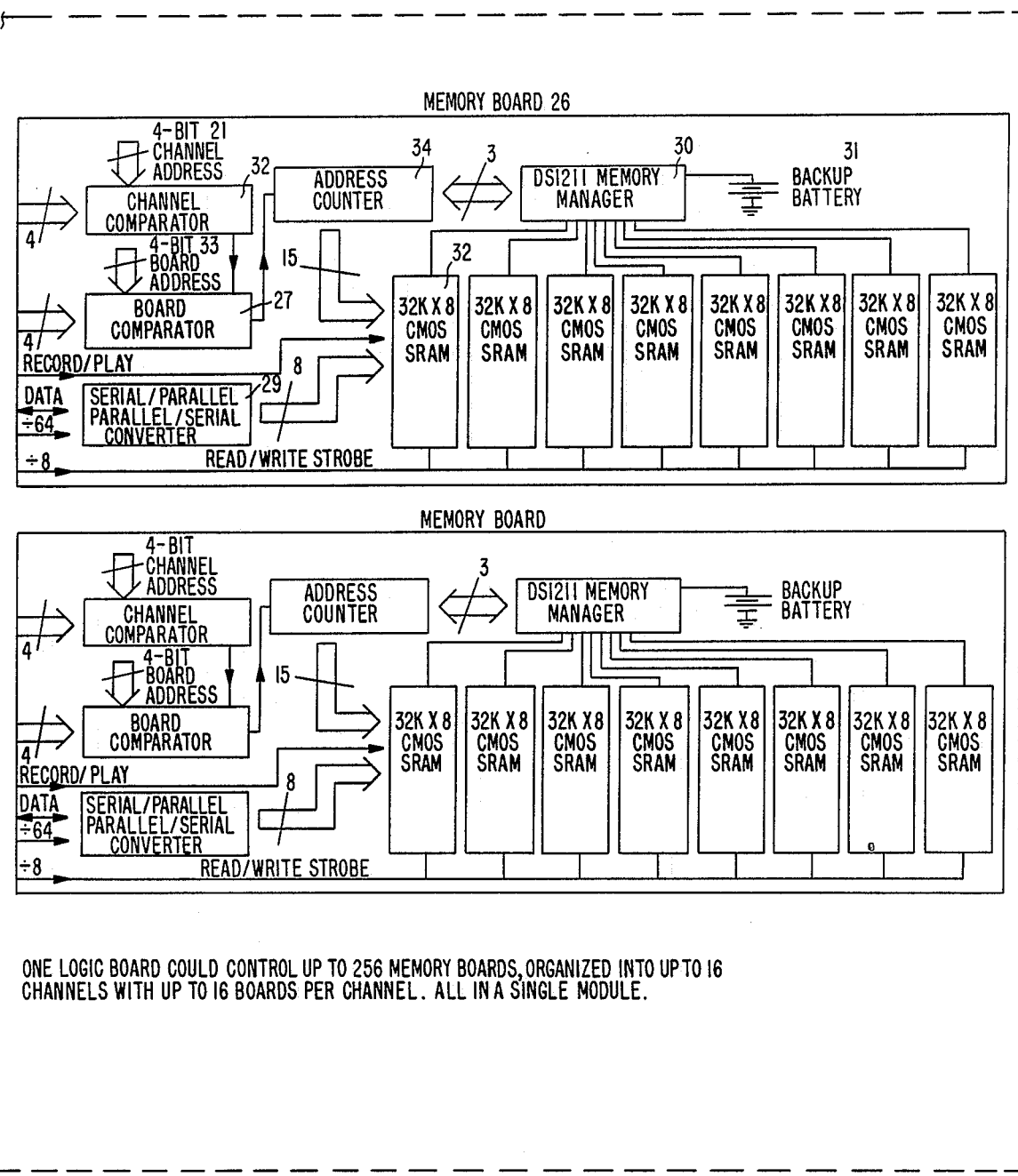
FIG. 2 is a block diagram showing a system according to the present invention having a plurality of the modules shown in FIG. 1.

With reference to FIG. 2, the digital random access recorder-player 10 of the present invention can include four modules. This provides 4 independent audio sources 37, plus crystal control master oscillator 39, power and interconnect cables. A system could have 4 logic boards and 1,024 memory boards (over 2,147 megabits of memory). Each channel 35 and each memory board 26 in a channel 35 may be addressed in any random manner by an external input from a CPU, manual controller or timer represented in FIG. 1 through external control 24. Control of a single module is possible through a 16-position hex switch, and a start sequence push button represented by manual control board 36 through the computer port represented in FIG. 1 as 23.

Messages may be loaded by direct audio input (−5 dBm, 600 Ohm, unbalanced) or by external digital input, local or remote. Power requirement is from 10 VDC to 15 VDC at less than 100 mA. This remains fairly uniform from a few memory boards 26 per module to many memory boards 26 per module. Low power CMOS chips are used, which only draw current during a transition, and only one memory board 26 and one memory chip is on at any time. Power supply may be a 12 VDC wall plug power supply, battery, solar power system or a thermoelectric generator.

Audio output per logic board is approximately 0.5 Watt at 8 Ohms unbalanced. A suitable matching transformer will provide balanced 600 Ohm output. The modular concept of the present invention is also applied to the memory boards 26. They may be removed, installed in any location, digital messages or programs may be loaded internally or externally and may be stored individually on the shelf for years, without loss of program. Low power CMOS static RAM memory chips are used, 8 or less memory chips per board, along with a single lithium battery 31, shown in FIG. 1, for memory retention. This technique is covered by U.S. Pat. No. 4,772,873. Lithium battery 31 use complies with UL standards (reverse current limited). In the power down mode, standby current is less than 10 microamps per board with a 3 VDC Lithium battery. Expected shelf life of a memory board 26 with a stored program is 8 to 10 years.

Referring to FIG. 1, a memory manager chip 30 manages the memory by isolating battery 31 when external power is available, and then applying battery 31 to the memory chips 32 if board 26 loses power. Also memory manager 30 provides the user warning if battery 31 begins to lose power by not enabling the user to load a new message.

In order to construct a modular, expandable system, a system buss must be created that will be expandable, and yet require a reasonable number of control lines to operate the external system. Referring to FIG. 1, three busses are defined, one for an external system to control the module, one for local control of the module 23, and a memory buss 28 for communicating to and from the memory boards 26 (using a 34 pin edge board connector).

The design philosophy of the memory buss 28 is to create a system that can access its messages randomly and in any order, not in a serial format like reel-type tape machines or the previous generation digital recorder. (See U.S. Pat. No. 4,772,873). Also, the memory bus 28 function should be independent of the order in which memory boards 26 are connected using separate channel 21 and memory board 33 numbers. The assignment of the pins of memory buss 28 is shown below as Table 1. In accordance with basic digital circuit connections, a line above a description indicates an active low. For example, at pin 17, updown means that when high, count up and when low, count down.

TABLE 1

| Pin # | Description |
|---|---|
| 2 | GND. |
| 4 | ON. +5 V FROM LOGIC BOARD WHEN RECORDING OF PLAYING. |
| 5 | WRITE ENABLE. FROM LOGIC BOARD TO MEMORY BOARD. STROBES DATA INTO MEMORY CHIPS DURING RECORD SEQUENCE. |
| 7 | OUTPUT ENABLE. FROM LOGIC BOARD TO MEMORY BOARD TELLS MEMORY CHIP THE DIRECTION OF DATA. WHEN HIGH, TELLS MEMORY TO RECORD AS PIN 5 IS STROBED. WHEN LOW, MEMORY TO PLACE DATA AT OUTPUT PINS. HIGH DURING RECORD AND LOW DURING PLAY |
| 8 | A1. LEAST SIGNIFICANT BIT. ⎤ |
| 10 | B1. ⎥ FOUR-BIT BOARD CODE |
| 12 | C1. ⎥ |
| 14 | D1. MOST SIGNIFICANT BIT. ⎦ |
| 9 | SERIAL DATA FROM LOGIC BOARD TO MEMORY BOARD. |
| 11 | DATA CLOCK. FROM LOGIC TO MEMORY BOARD, RUNS AT THE FREQUENCY OF THE SERIAL DATA, USED BY MEMORY BOARDS TO CONVERT SERIAL DATA TO EIGHT BIT PARALLEL. |
| 13 | DATA CLOCK. FROM LOGIC BOARD TO MEMORY BOARD. SAME FREQUENCY AS PIN 11 BUT ADVANCED IN TIME. USED BY MEMORY BOARDS TO CONVERT EIGHT-BIT PARALLEL OUTPUT OF MEMORY CHIPS TO SERIAL FORMAT USED BY CVSD. |
| 15 | ADDRESS CLOCK. FROM LOGIC BOARD TO MEMORY BOARD. RUNS AT ONE EIGHTH THE FREQUENCY OF THE DATA CLOCK. COUNTED BY MEMORY BOARDS TO PROVIDE ADDRESSING FOR MEMORY CHIPS. |
| 16 | A2. LEAST SIGNIFICANT BIT. ⎤ |
| 18 | B2. ⎥ FOUR-BIT CHANNEL CODE |
| 20 | C2. ⎥ |
| 22 | D2. MOST SIGNIFICANT BIT. ⎦ |
| 17 | UP/DOWN FROM LOGIC BOARD TO MEMORY BOARD. REVERSES ADDRESS COUNTERS FOR REVERSE EDITING FEATURE. |
| 19 | SELECT OUT. FROM MEMORY BOARD TO LOGIC BOARD. USED BY LOGIC BOARD TO INCREMENT BOARD NUMBER. |
| 21 | HALT. FROM MEMORY BOARD TO LOGIC BOARD. STOPS LOGIC BOARD FROM PLAYING OR RECORDING. |
| 23 | COUNTER STROBE. FROM MEMORY BOARD TO LOGIC BOARD. COUNTED BY VARIABLE LENGTH CONTROL TO MARK END OF MESSAGE. |
| 24 | 5 VOLT REGULATED POWER FROM LOGIC BOARD TO BUSS. |
| 25 | LAST BOARD. FROM MEMORY BOARD TO LOGIC BOARD. TELLS LOGIC BOARD THE LOCATION OF THE END OF THE CHANNEL. |

TABLE 1-continued
MEMORY BUSS

| Pin # | Description |
|---|---|
| 27 | SERIAL DATA OUT. FROM MEMORY BOARD TO CVSD OF LOGIC BOARD |
| 30 | RESET. FROM LOGIC BOARD TO MEMORY BOARD. RESETS ADDRESS COUNTERS ON THE MEMORY BOARD. |
| 32 | +12 VOLTS DC. UNREGULATED. |
| 33 | +3 VOLTS SECONDARY MEMORY BACKUP VOLTAGE. GROUNDED IF NOT USED. |
| 34 | GND. |

PINS 1,3,6,26,28,29 AND 31 ARE RESERVED FOR FUTURE USE.

Referring to FIG. 2, each channel 35 has a unique four-bit binary code. Each memory board 26 dedicated to a certain channel 35 has the same channel address code and a unique four-bit binary board address code. Referring to FIG. 1, the board 15 and channel 19 address codes on the memory buss 28 are compared with the settings on the memory board 26 via two four bit comparators 25 and 27. This arrangement allows for 16 channels 35 each with up to 16 memory boards 26 in each channel 35, for a total of 256 memory boards 32. When address codes of both counters 19 and 15 and counters 21 and 33 match, this enables the individual memory board. For example, a simple system might have two messages to be accessed randomly. This would require two channels 35 and as many memory boards 26 as needed for each message. The order of placement of the memory boards 26 would not matter. To reduce the number of pins, the data are passed serially from the logic board 22 to the memory board 26, where it is converted to parallel before it is placed into memory.

Figure 2:
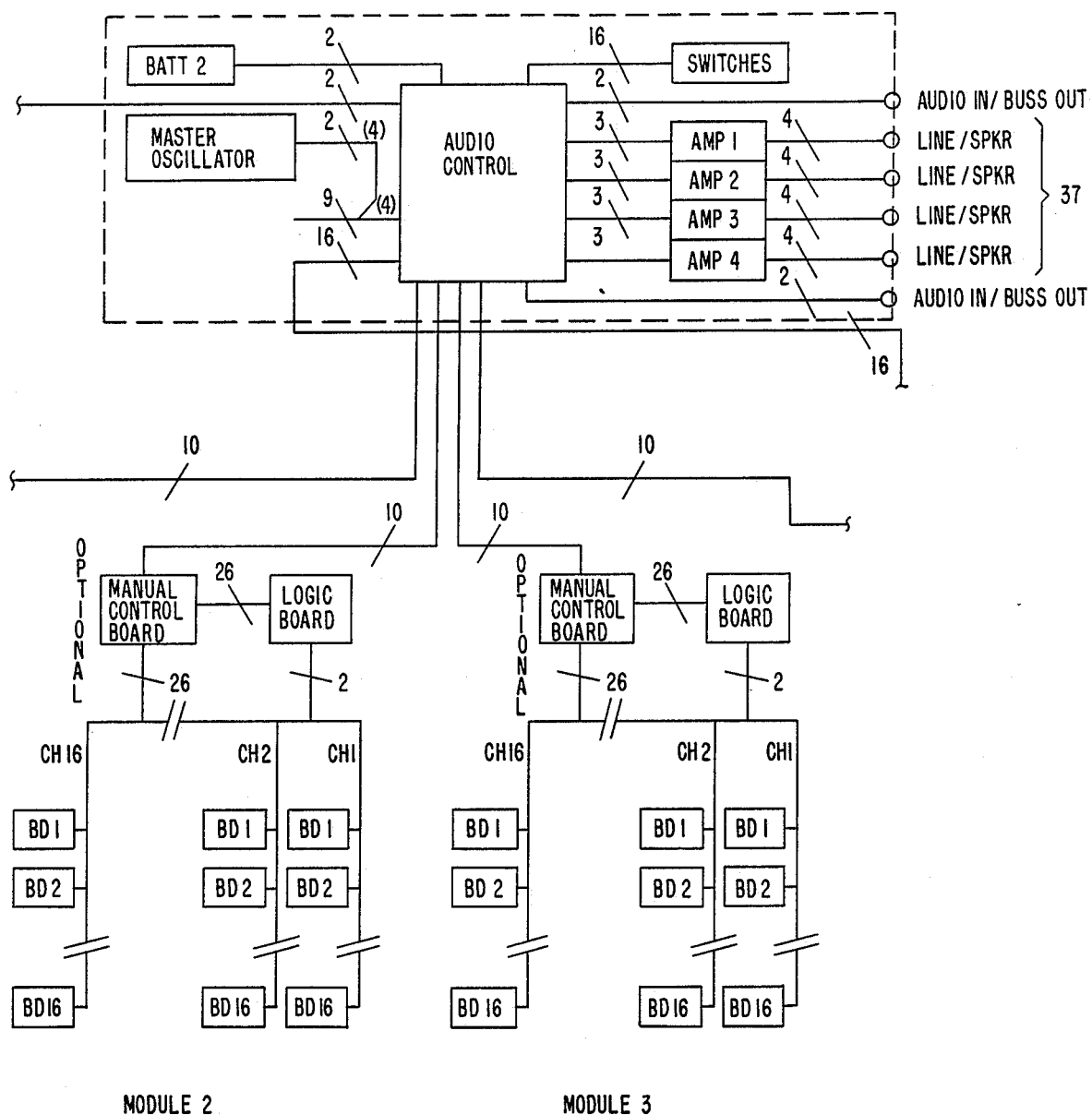
Figures 2, 3:
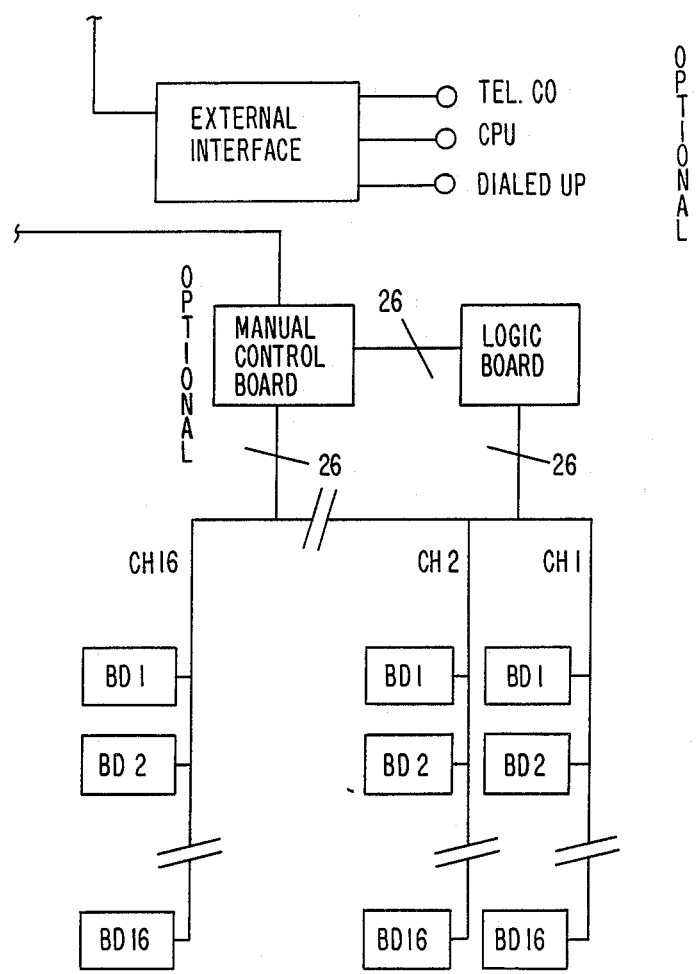
FIG. 3 is a timing diagram for the clocking system of the present invention.
Figure 3:
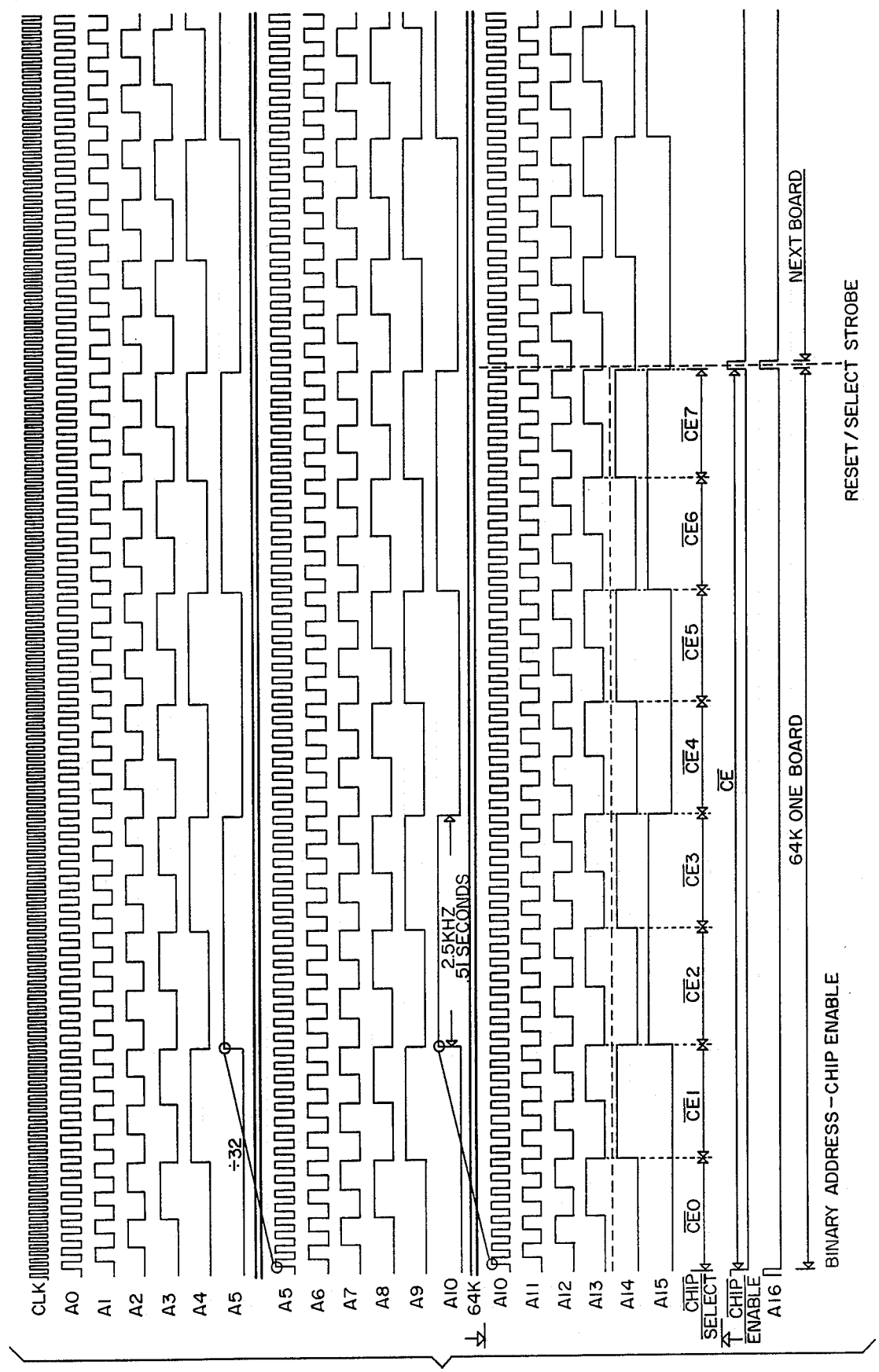

More than one clock is present on the bus 28, they differ in both frequency and time. Two clocks run at the rate of the data stream, for use by the serial to parallel and parallel to serial converters. Since each memory address stores eight bits, the data clock is divided by eight and fed to the address counters 34. This division is performed on logic board 22, and then fed through the memory buss 28 (edge pin 15 in Table 1). Two versions of the data clock are used, one advanced slightly in time with respect to the address clock and one slightly delayed. The advanced version of the data clock (edge pin 11 in Table 1) is used during the record sequence, to insure that the data arrives at the memory chips and is stable before the chip reads the data bus. The delayed version of the data clock (edge pin 13 in Table 1) is employed to insure that the data is stable before it is converted to serial and sent back to the logic unit. By displacing selected clocks in time, the need to resort to a handshaking timing protocol is avoided. A timing diagram for the clocks of the present invention are shown in FIG. 3.

Figures 1, 4:
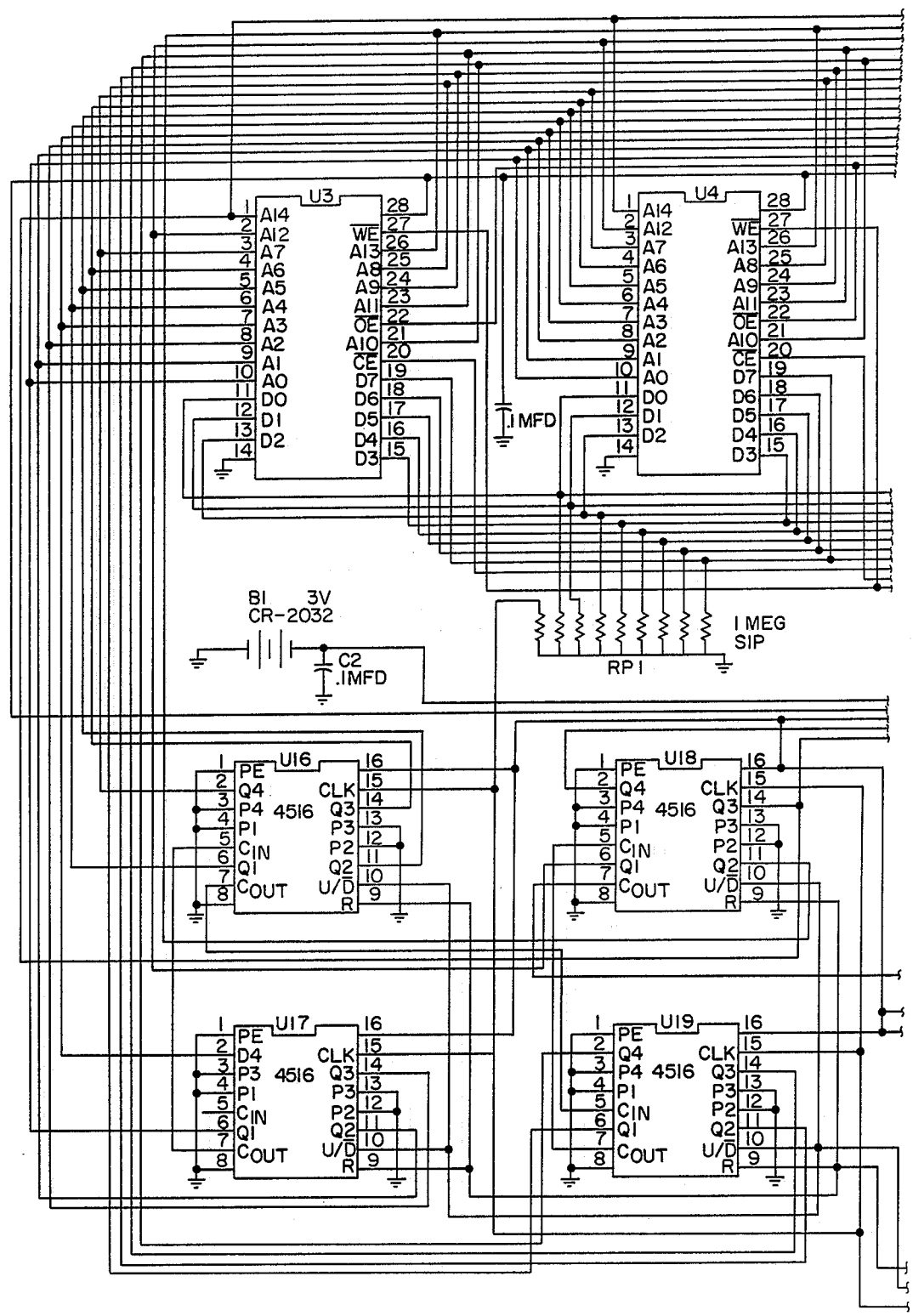
FIG. 4 is a schematic diagram of part of the memory unit of the present invention.
Figures 2, 4:
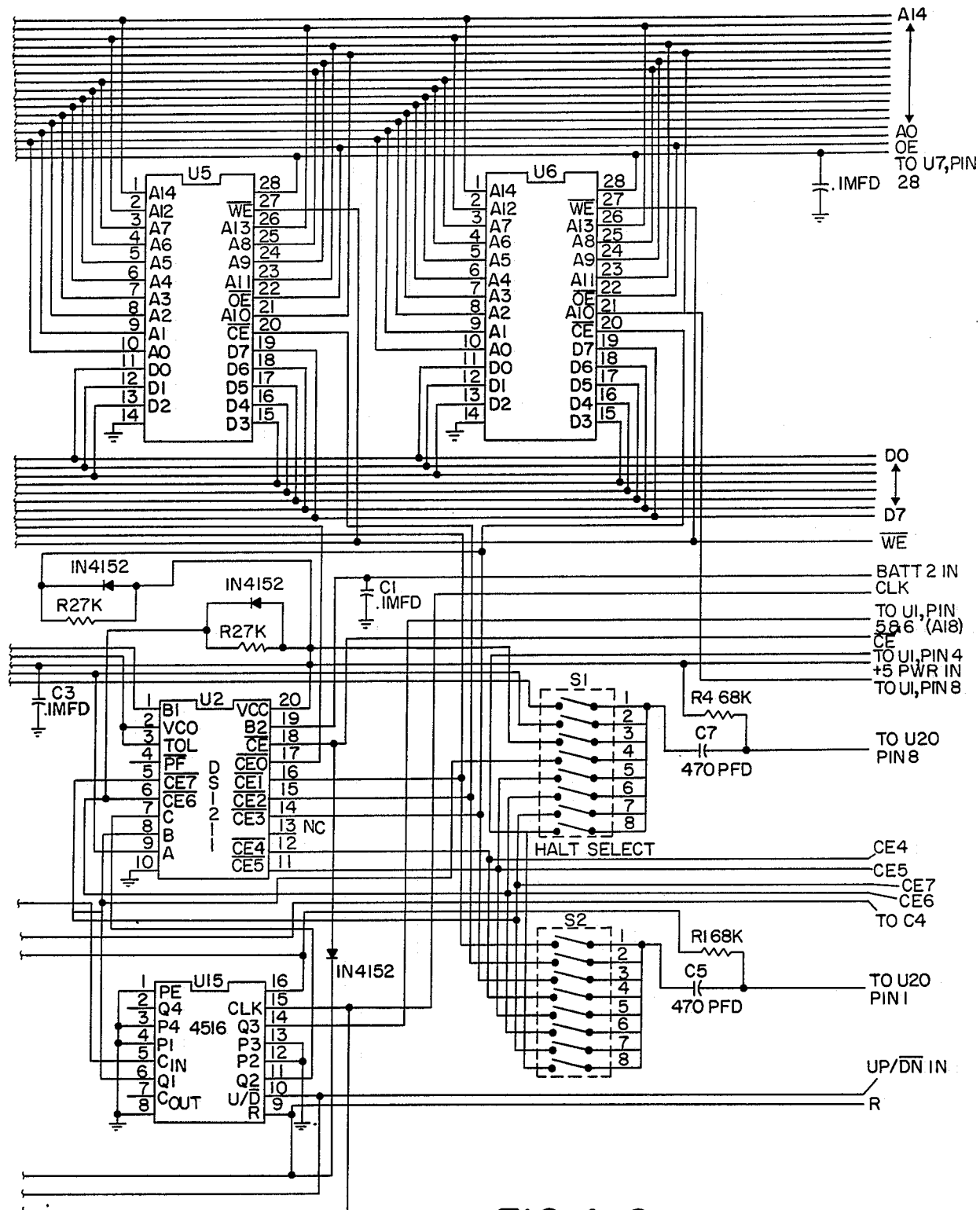
Figures 1, 5:
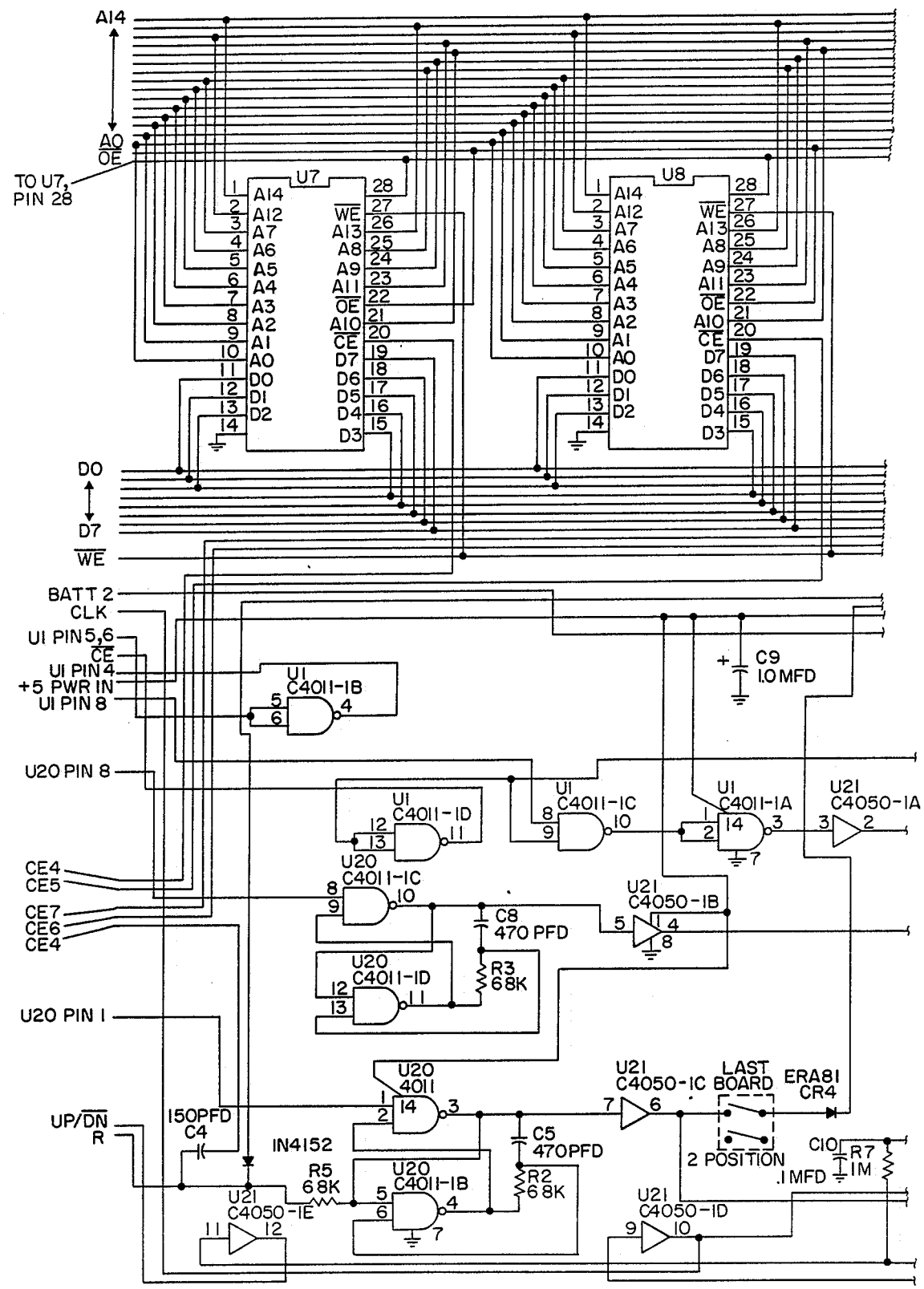
FIG. 5 is a schematic diagram of part of the memory unit of the present invention.
Figures 2, 5:
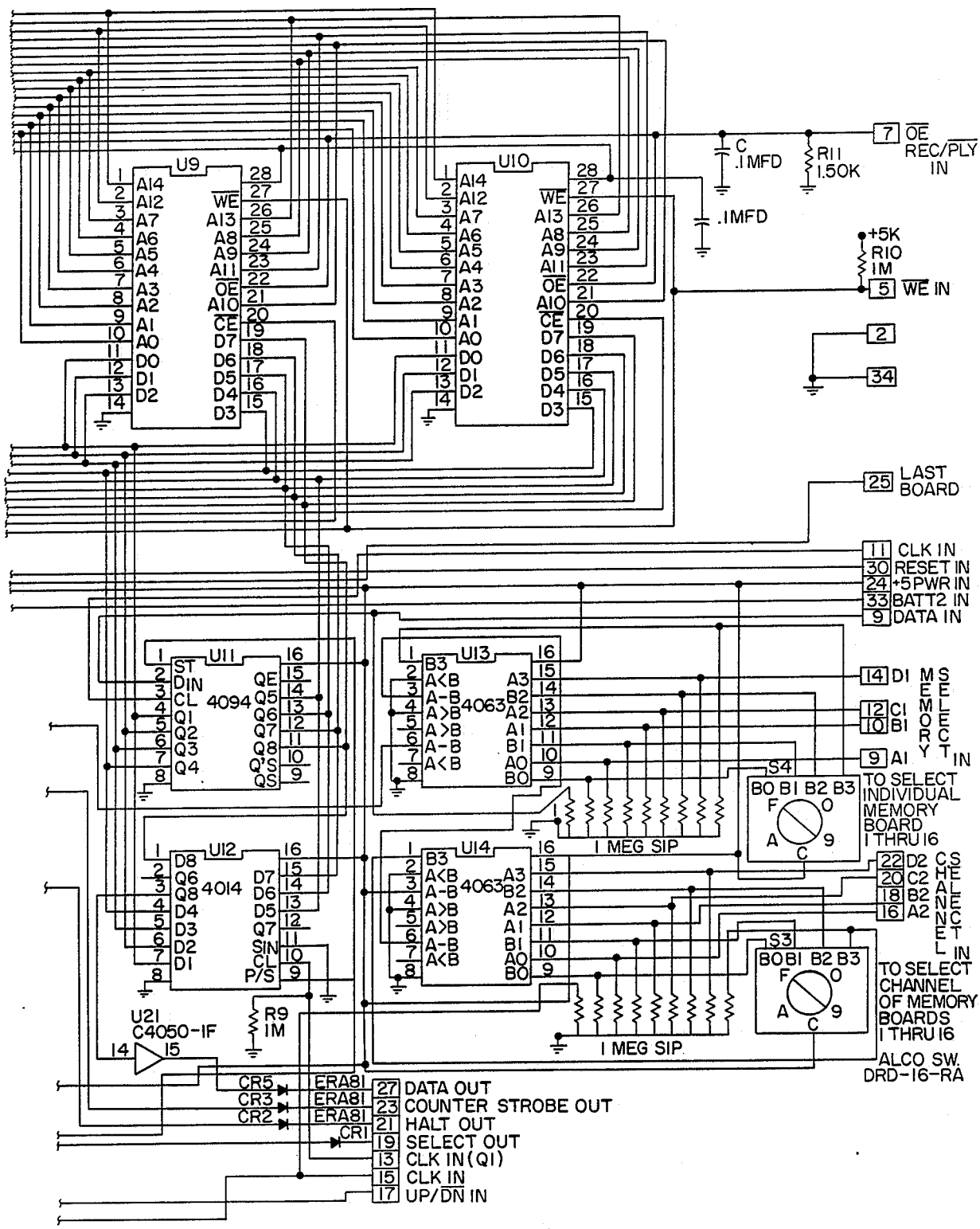

With reference to FIGS. 4 and 5, in order to achieve random access memory, the present invention uses 2 four bit address codes to initialize any given memory board 26. Five volt power (a logic high) is supplied to the A=B input of U14, the four bit comparator 25 of FIG. 1, which compares the channel number address code on buss 28 with the setting of a 16 position channel switch 21 of the memory board 26. If the address codes match, then a logic high is supplied in a similar manner to U13, the four bit comparators 27 shown in FIG. 1, which compares the memory board address code on the memory buss 28 with the preset 16 position memory board switch 33. Again, if the address codes match, then a memory manager chip, U2, is enabled.

U2 acts as the memory manager for the memory board 26, performing several important functions. Beside allowing data to be written to memory board 26 when the memory board 26 is selected, U2 also decodes the three most significant bits of the address to enable the individual memory chips, and switches power from VCC or the battery to prevent corruption of the memory. U2 also will not allow access or memory if the voltage across the battery falls below a set limit.

The present invention may use an eight-bit serial to parallel converter to store eight bits of digital system at a time. Memory board 26 may include a 256K memory organized 8 by 32K. The invention could use memory board 26 organized as 1 by 256K and avoid the serial to parallel process, but eight bit data buses are currently the industry standard. The memory boards 26 can also accept a variety of memory technologies. CMOS static RAMs provide instantaneous record and play, while EPROMs and EEPROMs can provide fixed play only.

Addresses for the memory chips are provided by dividing the address clock (edge pin 15 in Table 1) by five cascaded fourbit up-down address counters (shown as 34 in FIG. 1) for reverse as well as forward (U15, U16, U17, U18, and U19 in FIG. 4). The first 15 least significant binary digits (A0-A14) are used first 15 least significant binary directly by the memory chips as addresses. The three most significant digits are decoded by U2 to enable each memory chip in turn.

During a record cycle, edge pin 7 is set high to enable the memory chips to read data and enable the serial to parallel converter, U11 in FIG. 5. Data is passed in a serial format from the logic board 22 to the memory board 26 by edge pin 9, converted to parallel by U11, and strobed into memory chips (U3, U4, U5, U6, U7, U8, U9 and U10) by pin 5.

During a play cycle, edge pin 7 is pulled low to allow the memory chip selected by U2 to place the data corresponding to the address supplied by address counters 34 on the data bus. This occurs when a memory chip has a stable address input, no strobing is necessary. The data on the data bus is latched in to the parallel to serial converter (U12) on the rising edge of the address clock (edge pin 15), and clocked out serially by edge pin 13. The data is buffered and transmitted back to logic board 22 via edge pin 27 for conversion to analog. U12 is on all the time, so that during a record cycle, the data is passed back to the logic board 22 so that the user can hear what is actually being recorded, not just the audio source.

To control how long a message is, the user has three switches on memory board 32. The first switch, S1 in FIG. 4, allows the user to set the system to halt at one of eight positions in memory. The inputs of S1 are hooked up to either high-order address bits or memory chip enables of memory manager 42. Only one of the eight switches can be closed at one time. The outputs of the switch are together and tied to a falling-edge pulse generator, which generates a positive square wave on edge pin 21. This causes logic board 22 to disable the clock, leaving the address counters 34 of memory board 32 as the end of the message.

The second switch, S2 in FIG. 4, is the chip select switch; it increments the board counter on logic board 22 at one of eight points in memory. The inputs of the switch are hooked to the chip enables of memory manager U2, or the most significant bit of the address counters (A18) if the message is to use all the memory available. Only one switch is to be connected at any one time. In a similar manner as the halt switch, the outputs on the select switch are all tied together and then fed to a falling edge triggered pulse generator. The pulse is buffered and then fed to logic board 22 through edge pin 19. A positive pulse on this line will cause the system to reset address counters 34 and replay from the beginning if restarted. The third switch is the last board out switch (S5 in FIG. 5) which when on connects the halt out (edge pin 19) which will cause the channel counters 19 on logic board 22 to reset.

Figures 1, 6:
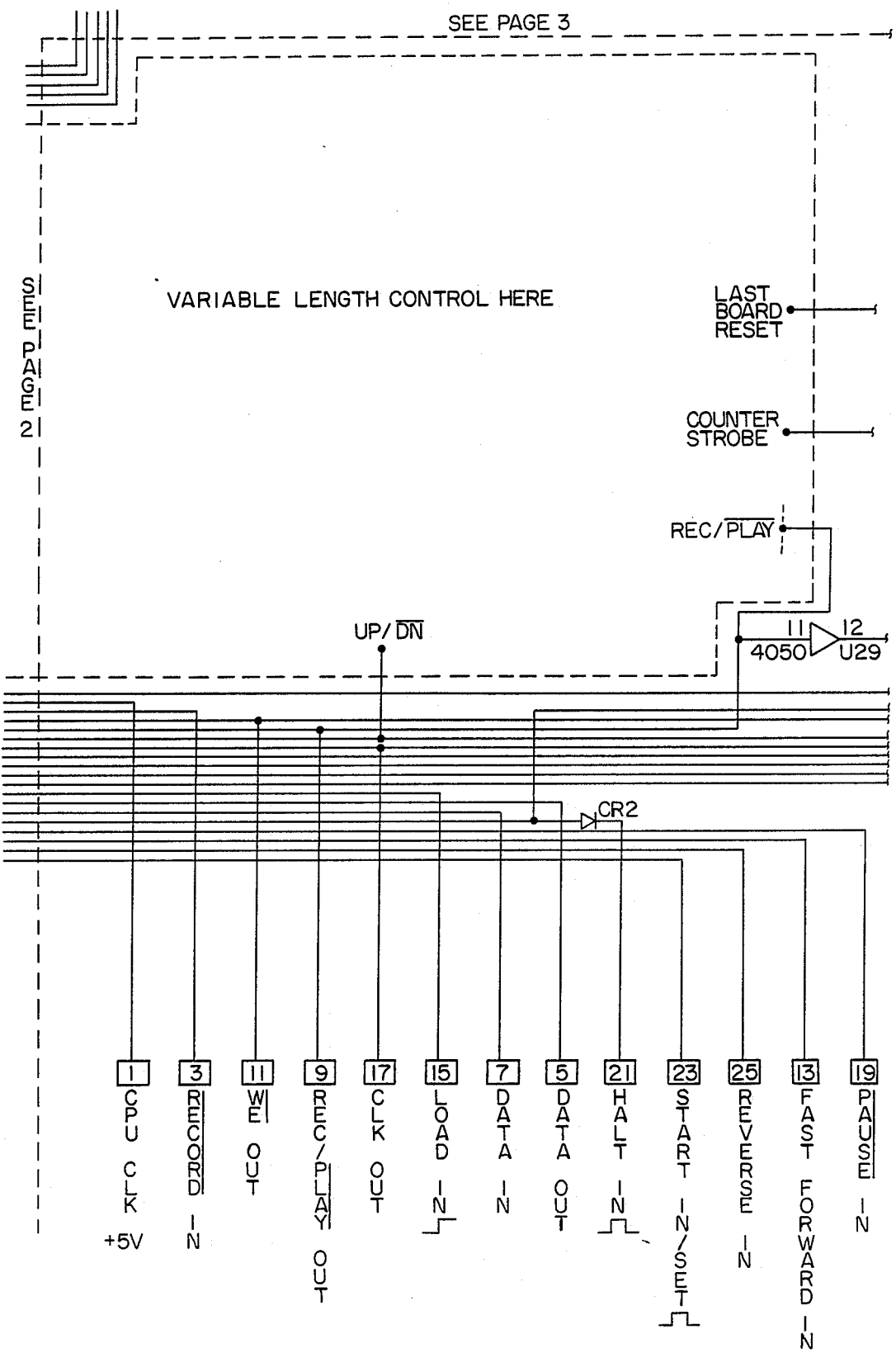
FIG. 6 is a schematic diagram showing the relationships of a variable length message control to the logic board of the present invention.
Figures 2, 6:
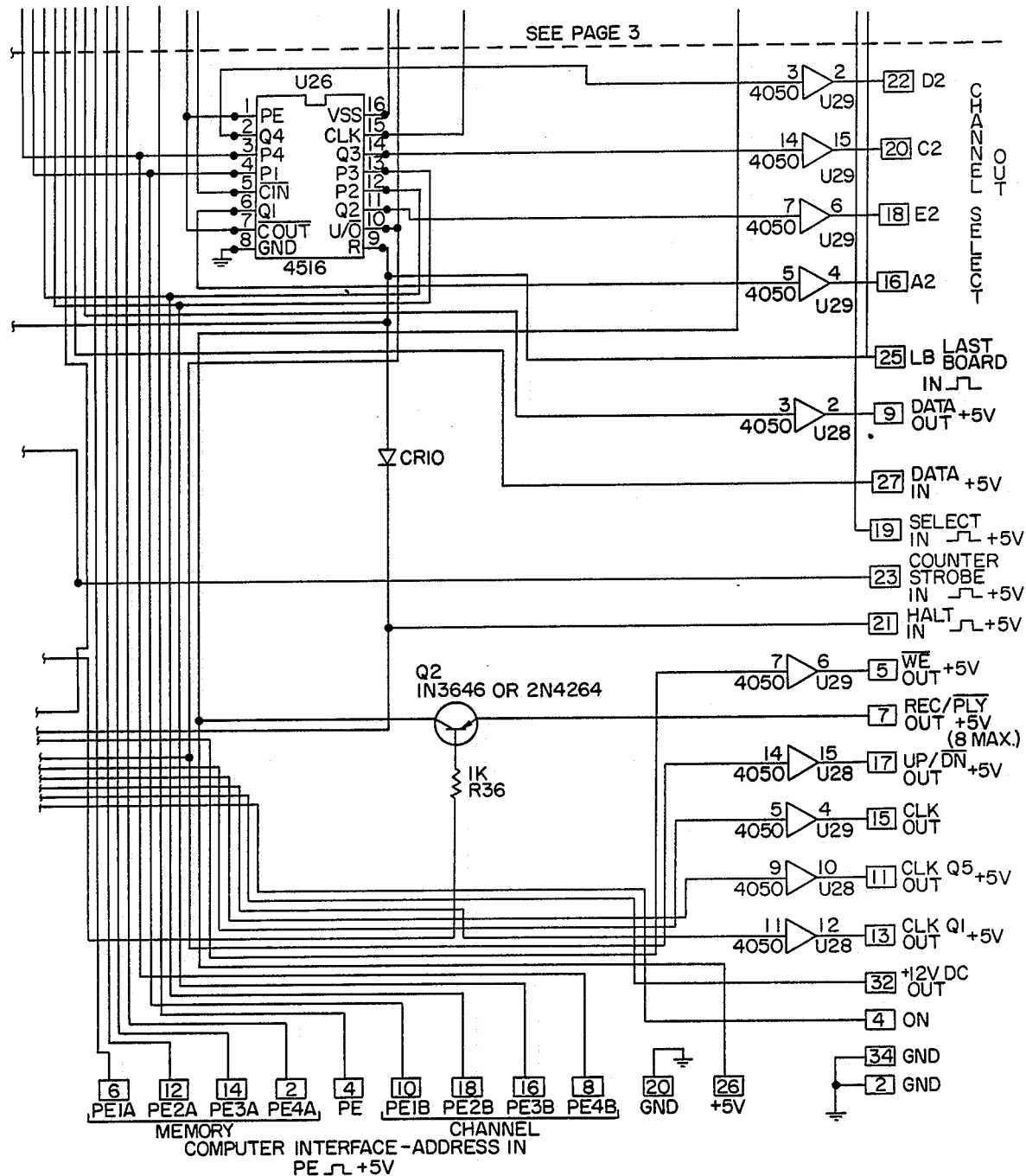
Figures 1, 12:
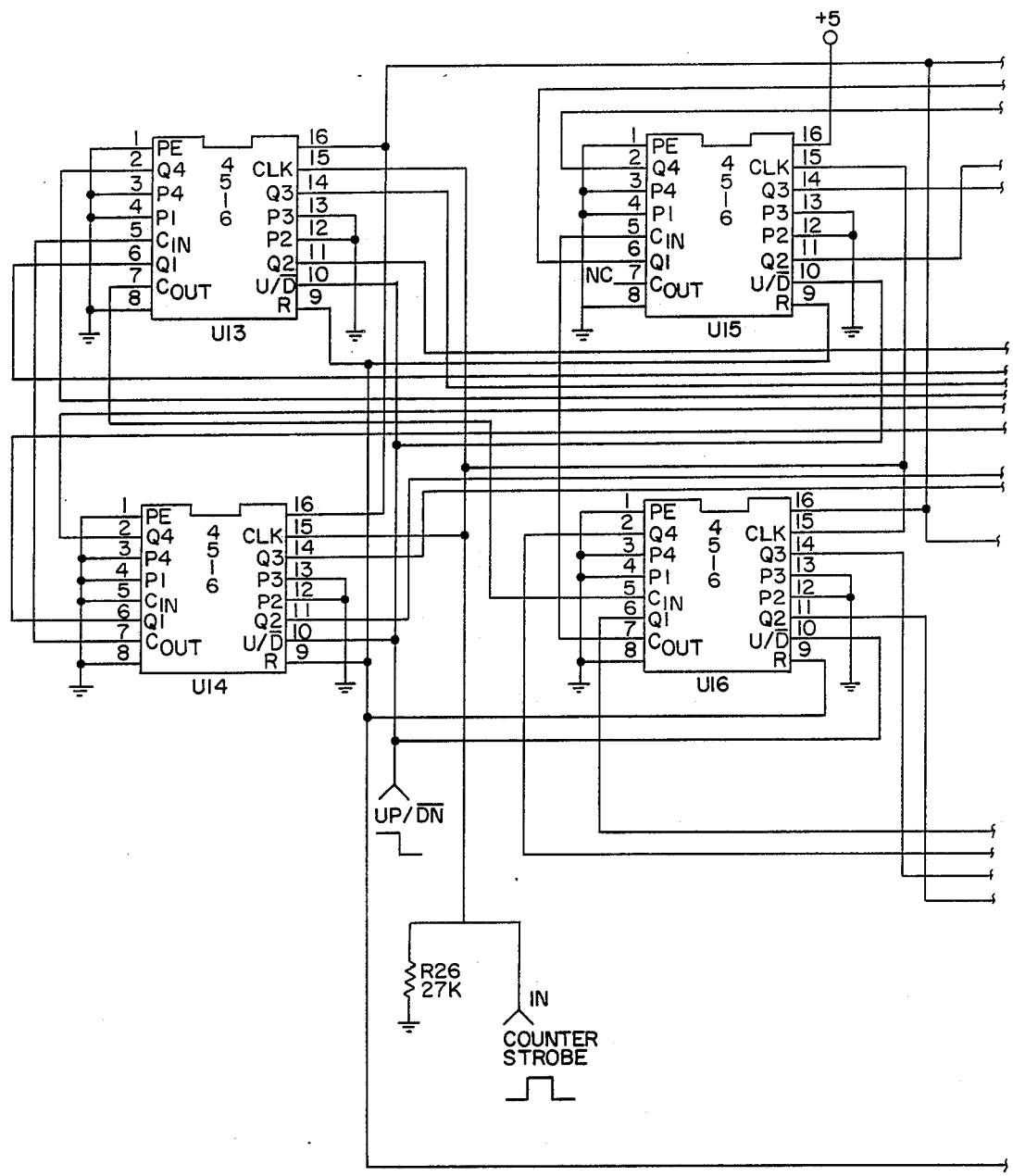
FIG. 12 is a schematic diagram of the variable length control of the present invention.
Figures 2, 12:
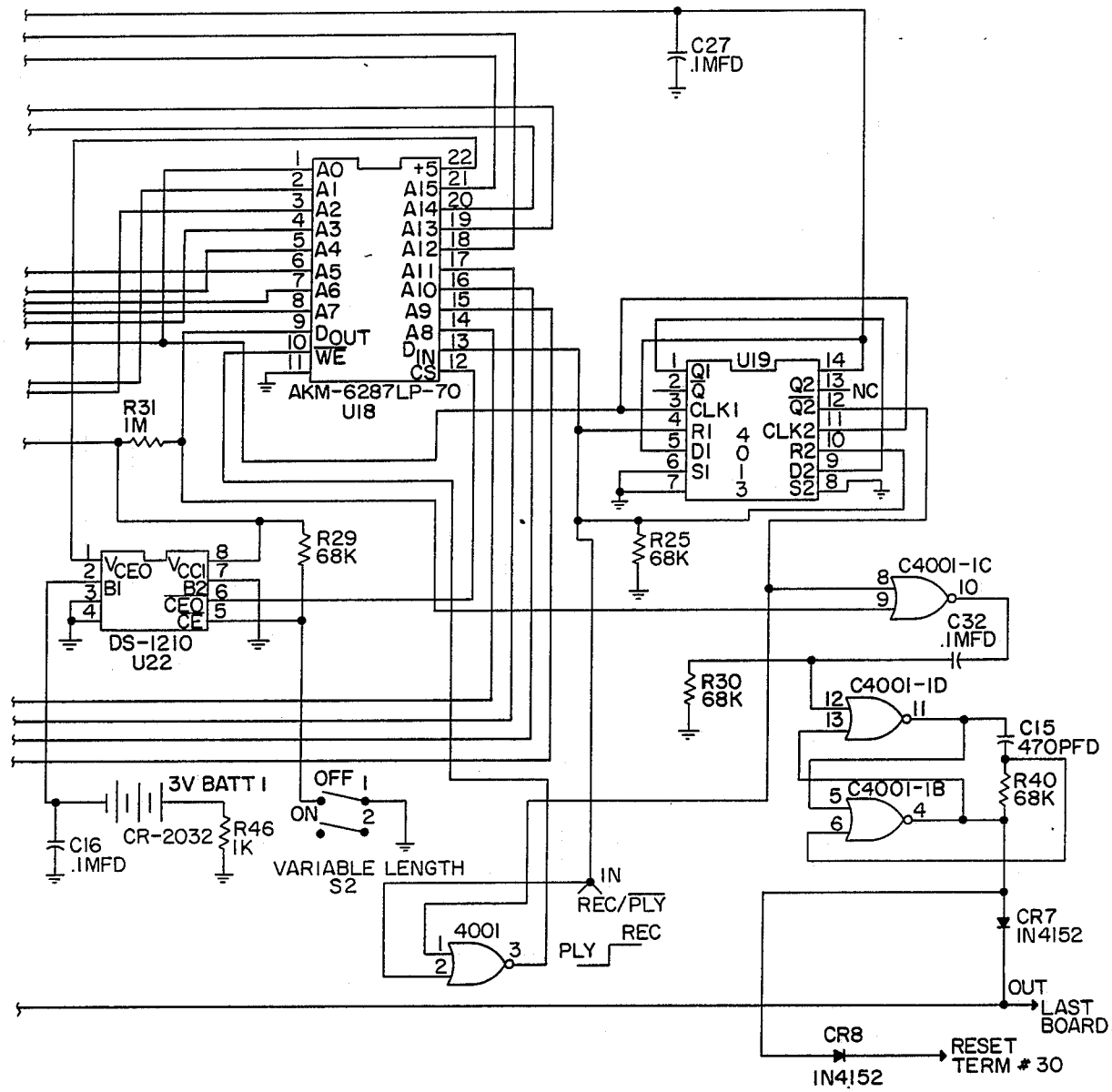

As indicated in FIG. 6, the other output to logic board 22 is the counter strobe out, which is counted by a variable length control (see FIG. 12). It is produced by the board that is active, by adding the output of U14 and U13 in FIG. 5 with a high order address bit, A10.

Logic board 22 controls one module, performing many different functions to control the system. It is the controller, for memory boards 26, the encoder for analog to digital conversion, the decoder for the digital to analog conversion, the interface for system and module control, and provides timing for the individual module.

A module can consist of just one logic board 22 and a memory board 26, or one logic board 22 up to 256 memory boards 26. A module can be organized into 16 separate channels 26 with up to 16 memory boards 32 per channel. Referring to FIG. 2 channel display and channel select board 38 are options that can be included is a module. Logic board 22 ties them all together.

The control of more than one module at a time is accomplished by a system control port (J1), the connection assignments of which are shown below in Table 2 and as will be discussed more fully below.

TABLE 2

SYSTEM CONTROL PORT (J1) USED BY AN EXTERNAL DEVICE TO CONTROL A MORE THAN ONE MODULE AT A TIME

| Pin # | Description |
|---|---|
| 10 | BATT 2 IN. AUX MEMORY BATTERY. GND IN NOT USED. |
| 5 | AUDIO BUSS OUT. |
| 4 | GND. |
| 6 | SINGLE SPEAKER AUDIO OUT. 8 OHM. 0.5 WATT. |
| 7 | GND. |
| 8 | $\overline{\text{AUTO SEQUENCE IN.}}$ |
| 1 | MASTER CLOCK IN +12 VOLTS. |
| 2 | START CYCLE IN. |
| 9 | FINISH CYCLE OUT. |

Module control for random access preferably is accomplished by use of an external device via a computer interface (J2) shown in Table 3 below and as described more fully below.

TABLE 3

COMPUTER INTERFACE (J2) USED BY AN EXTERNAL DEVICE TO CONTROL A MODULE

| Pin # | Description |
|---|---|
| 1 | EXTERNAL CLOCK. |
| 3 | $\overline{\text{RECORD}}$ LOW FOR RECORD, HIGH FOR PLAY. |
| 11 | $\overline{\text{WRITE ENABLE}}$ HIGH FOR RECORD. LOW FOR PLAY. |
| 9 | RECORD/$\overline{\text{PLAY}}$ OUTPUT. |
| 17 | CLOCK OUT. |
| 15 | LOAD IN HIGH TO LOAD IN DIGITAL DOMAN THROUGH PIN 7. |
| 7 | DATA IN. |
| 5 | DIGITAL DATA OUT. |
| 21 | HALT IN. IGNORED IF IN RUN MODE. |
| 23 | START IN. |
| 25 | REVERSE IN. |
| 13 | FAST FORWARD IN. |
| 19 | $\overline{\text{PAUSE}}$ IN. |
| 6 | PE1A LEAST SIGNIFICANT BIT. |
| 12 | PE2A. |
| 14 | PE3A. |
| 2 | PE4A MOST SIGNIFICANT BIT. |
|   | — FOUR BIT BOARD CODE IN |
| 4 | PRESET ENABLE STROBED IN BOARD AND CHANNEL CODE WHEN PULSED. |
| 10 | PE1B LEAST SIGNIFICANT BIT. |
| 18 | PE2B. |
| 16 | PE3B. |
| 8 | PE4B MOST SIGNIFICANT BIT. |
|   | — FOUR BIT CHANNEL CODE IN. |
| 20 | GND. |
| 26 | +5 VOLTS REGULATED. |

(PINS 22 AND 24 ARE RESERVED FOR FUTURE USE).

Figures 1, 7:
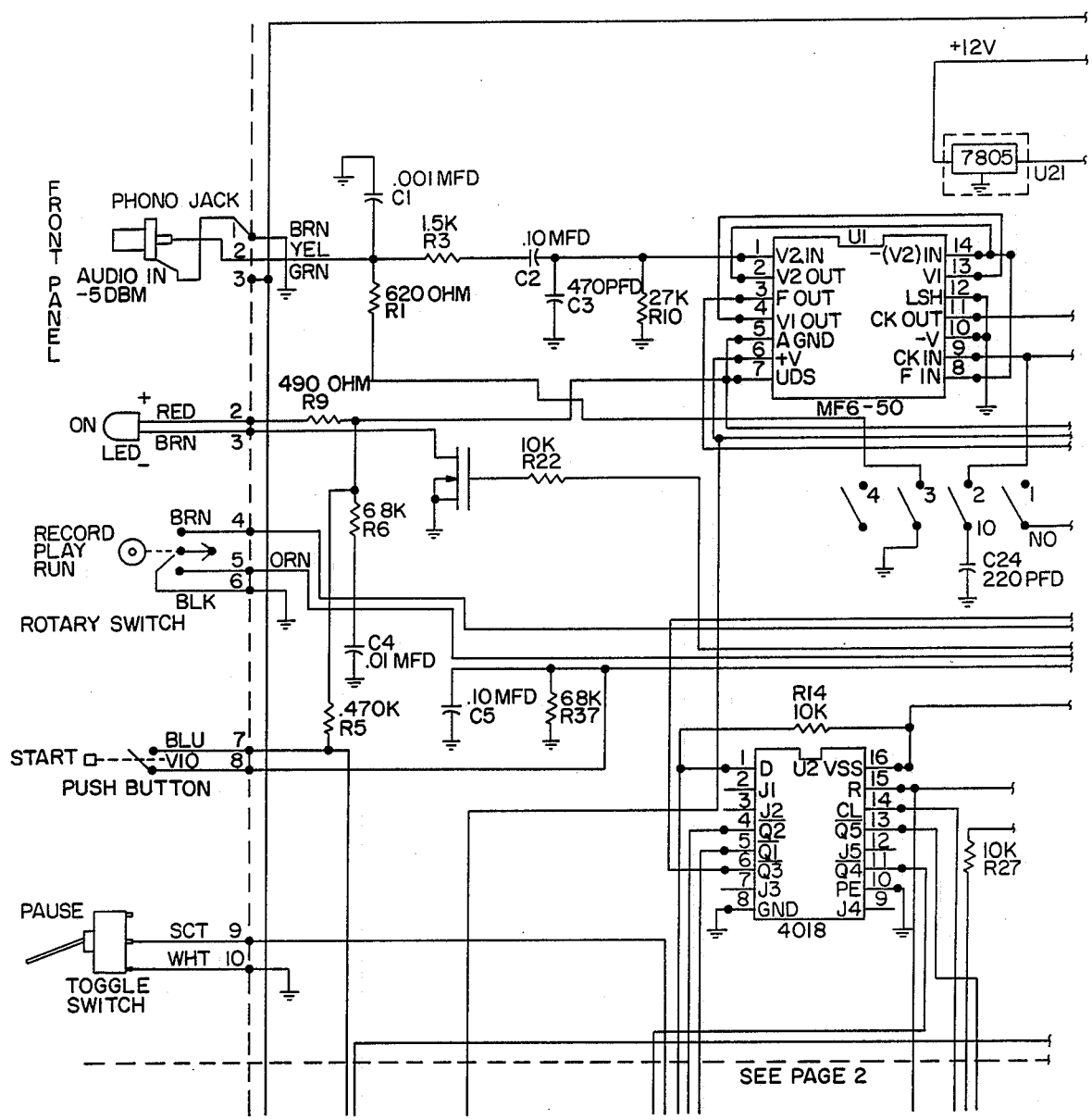
FIG. 7 is a schematic diagram of part of the logic board of the present invention.
Figures 2, 7:
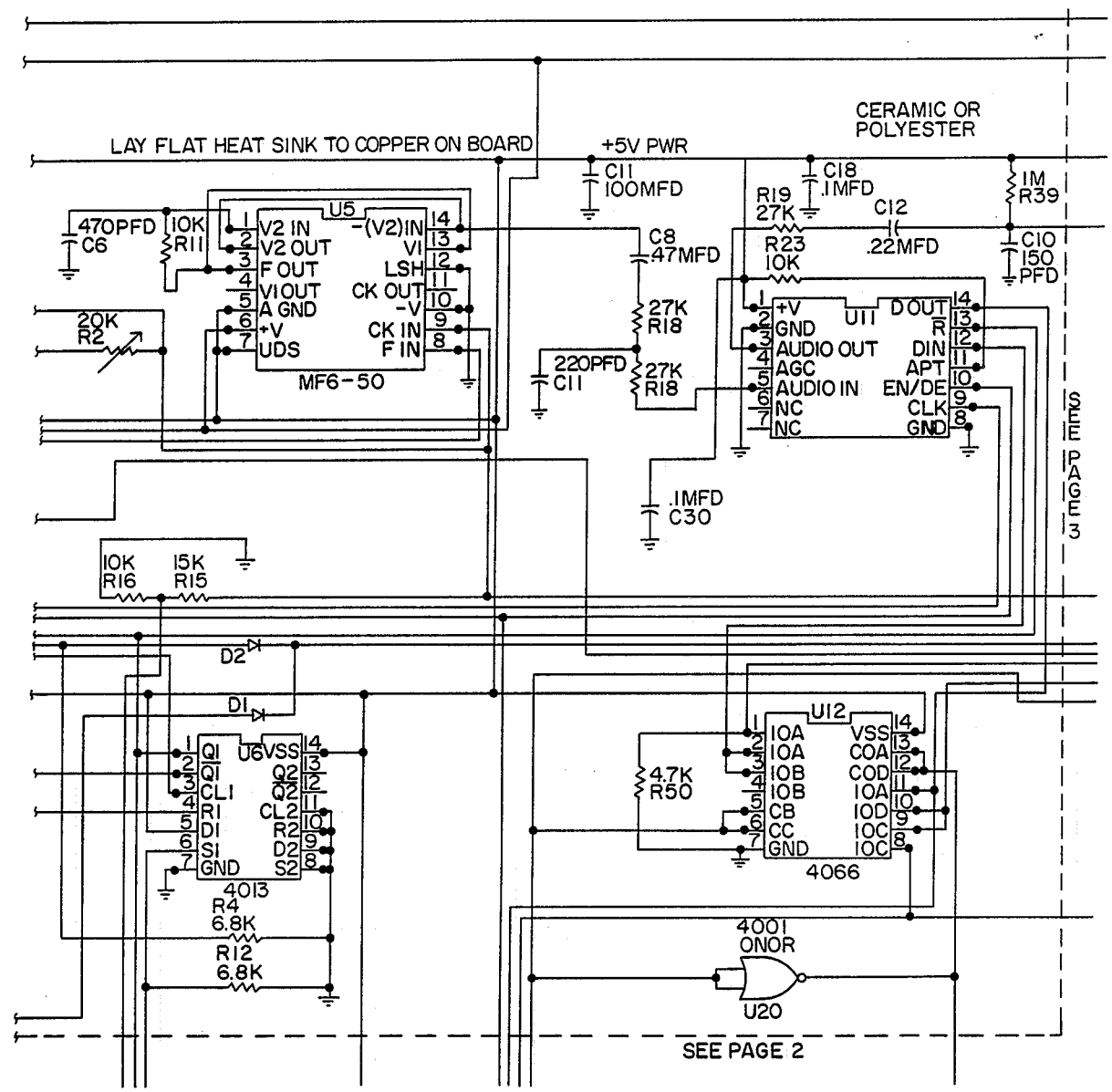
Figures 1, 8:
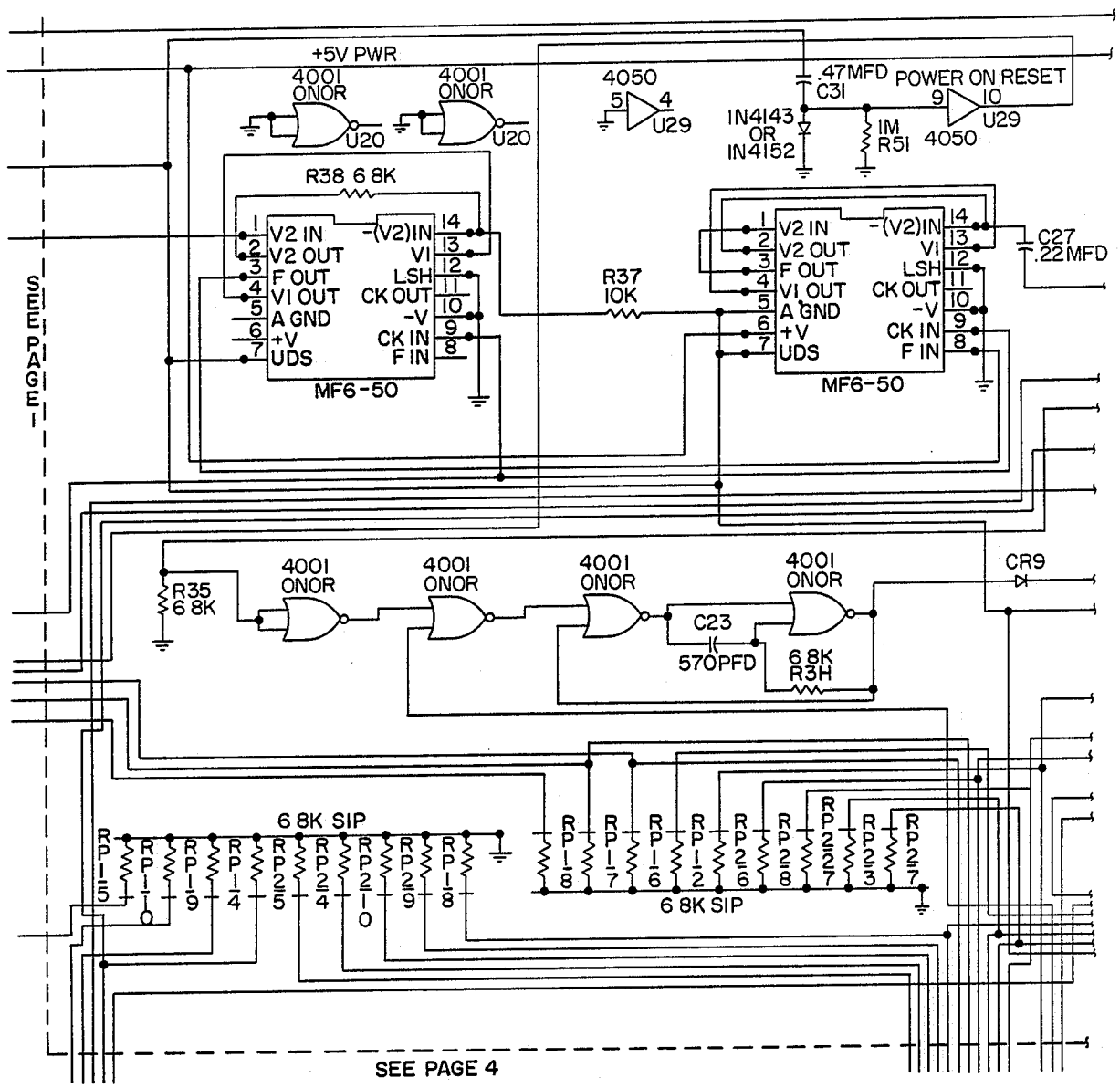
FIG. 8 is a schematic diagram of a part of the logic board of the present invention.
Figures 2, 8:
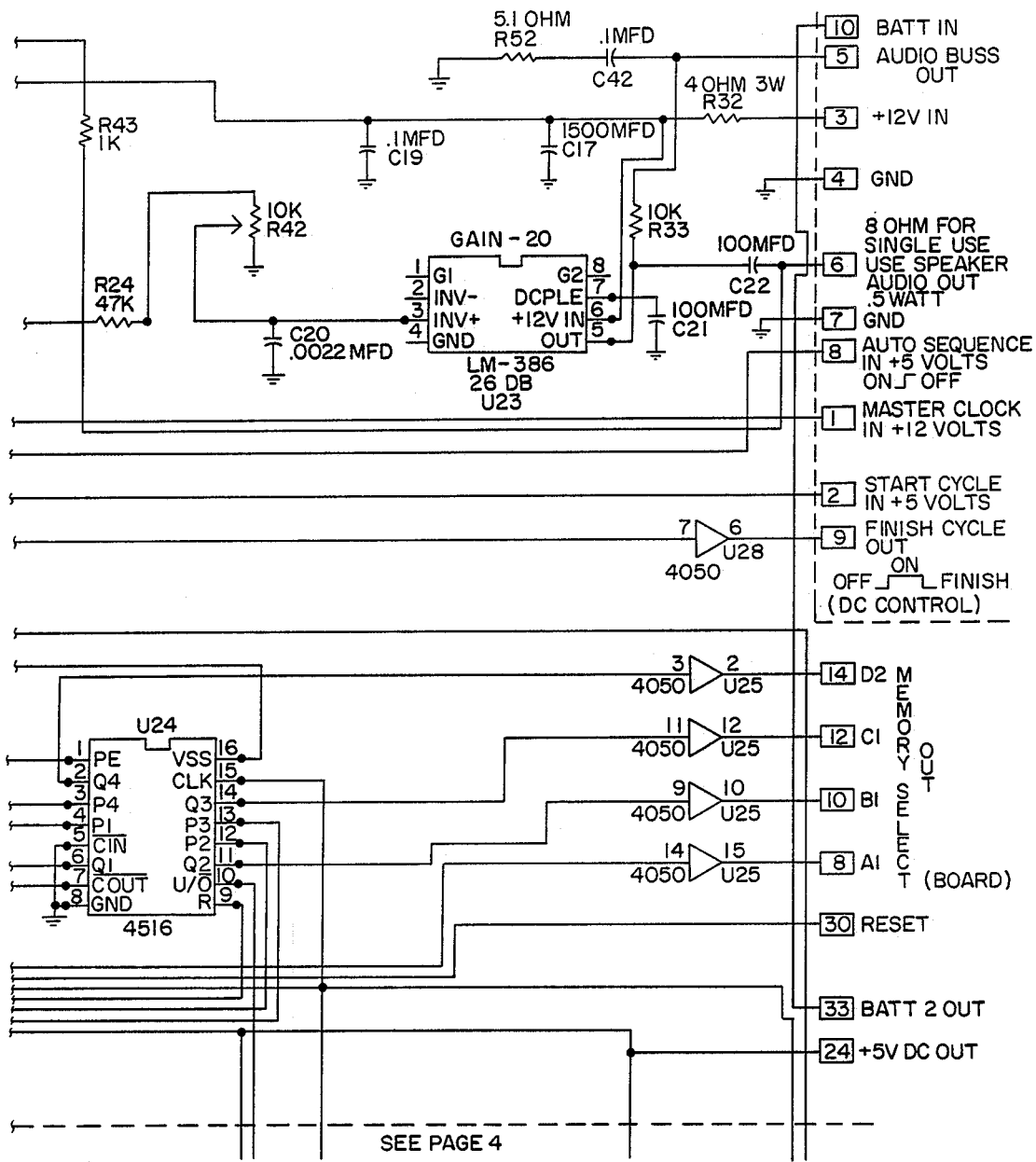
Figures 1, 9:
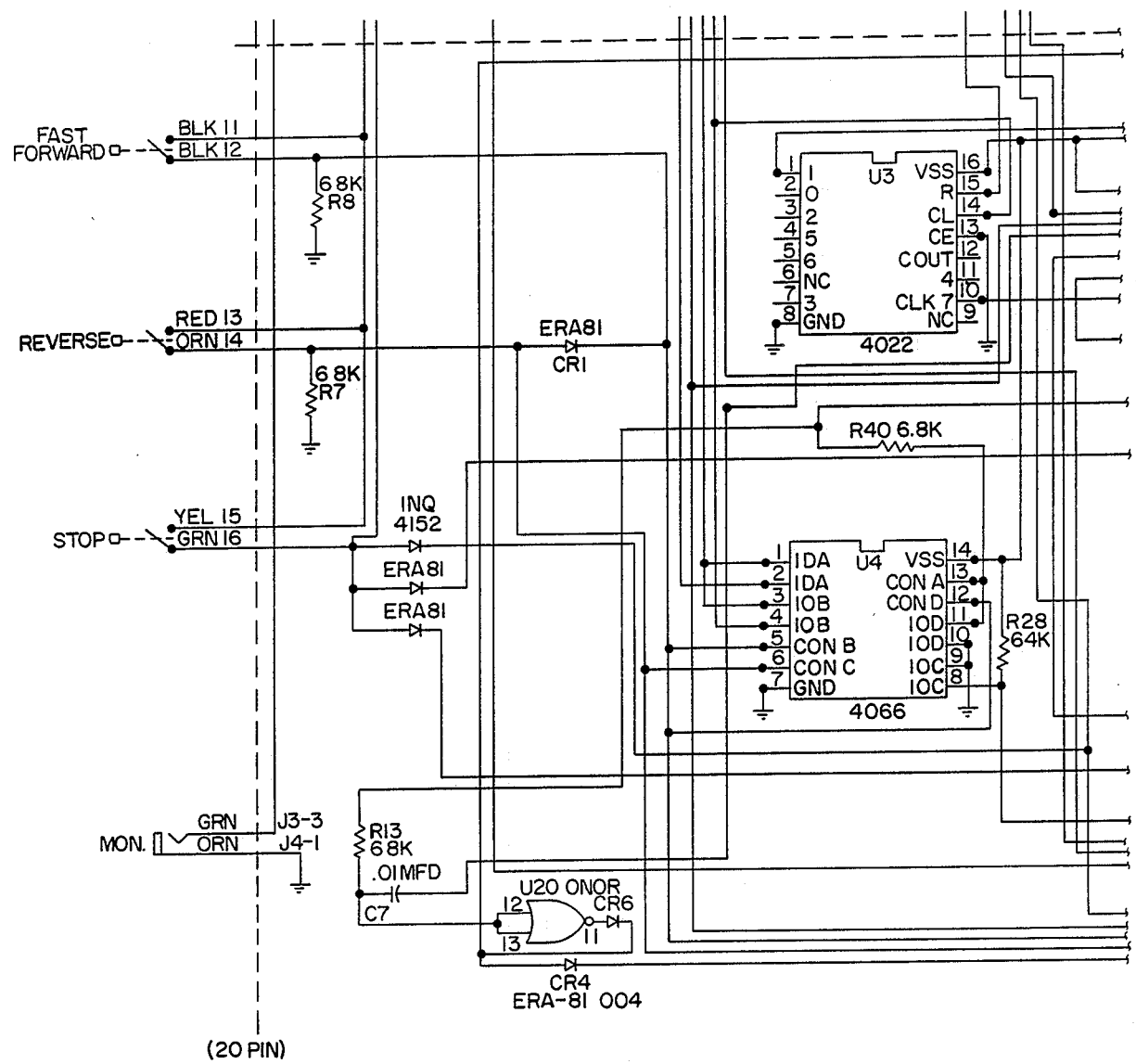
FIG. 9 is a schematic diagram of part of the logic board of the present invention.
Figures 2, 9:
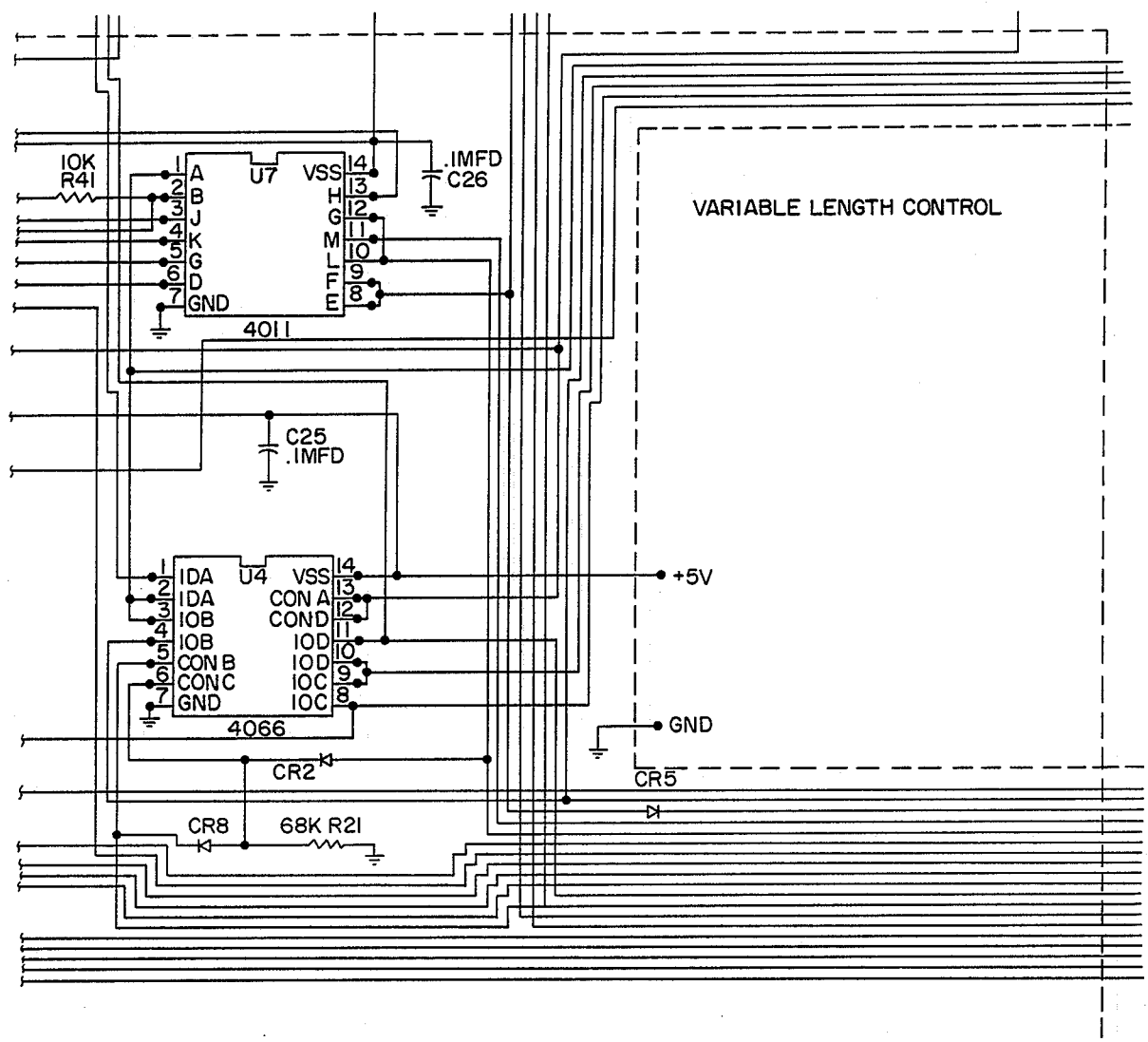

With reference to Tables 2 and 3 and FIGS. 7, 8 and 9, it can be seen that logic board 22 communicates through the three separate system buses described above. For control of the memory, logic board 22 communicates through a 34 line edge pin connector memory buss 28 at the back of the board. All memory boards 26 are connected to this memory buss 28. Logic board 22 receives control command through two busses, one from the system (J1 shown in Table 2) and one from local control (J2 shown in Table 3).

The analog signal ( −5dBm, 600 Ohms, unbalanced) enters through a phono jack on the face of the logic board. R1 in FIG. 7, a 620 Ohm resistor, can be switched in parallel with the input to provide the proper termination resistance. The analog signal to be recorded is next filtered by a simple RC network R3 and C2 in FIG. 7 in series to block DC and very low frequencies below 70 HZ. C3 in FIG. 7 in parallel with ground removes any radio frequency signals that may be present in the input or that may emanate from the digital filter. The analog signal is fed into a two-stage, 12-pole, low-pass, anti-aliasing filter network (U1 and U5 in FIG. 7) to prevent foldover distortion of the analog audio signal when sampled. Preferably U1 and U5 are two National Semiconductor MF6-50 6-pole digital filters cascaded. The MF6-50 also has op-amps on the chip to buffer the input signal. A simple RC network is used with an op-amps to short any radio or clock frequencies that may couple with the audio line to ground.

With a digital filter, the cutoff frequency is a function of the sampling period, allowing the user to change the audio bandwidth without changing board components. For the MF6-50, the cutoff frequency is 1/50th of the filter sampling frequency. The MF6-50 can generate its own clock or be slaved to an external clock. A single module of the present invention generates its own clock from the first MF6-50 (U1). And all the other MF6-50's and the CVSD chip are slaved to it to prevent harmonic heterodyning (constructive interference of the higher harmonics of the filter clock). If a module is operated as a part of a multiple module system, then all filters are slaved to the system oscillator. All other clocks used by logic board 22 are divided off the filter clock.

Since the filter clock frequency is a function of C24 and R2, the frequency of the whole module can be changed by adjusting R2, a variable resistor. So the upper limit of the audio bandwidth of the recorded signal can be changed very easily. The following chart shows the relationship between the sampling frequency, amount of memory, and bandwidth:

| Audio bandwidth | Time per 2 megabit memory board | CVSD filter frequency | CVSD sampling frequency |
|---|---|---|---|
| 2.5 kHz | 2m, 11s | 127.8 kHz | 15.9 kHz |
| 3.5 kHz | 1m, 33s | 178.9 kHz | 22.4 kHz |
| 5.0 kHz | 1m, 5s | 255.6 kHz | 31.9 kHz |
| 7.5 kHz | 42s | 397.7 kHz | 49.7 kHz |
| 10.0 kHz | 33s | 511.3 kHz | 63.9 kHz | m = minutes
s = seconds

After the input audio has been filtered by U1 and U5, the analog input is converted to digital by U11 in FIG. 7. Since the audio bandwidth is 1/50th of the filter clock, the CVSD frequency is set at 1/8th of the filter clock to insure that the input signal is not undersampled. The CVSD chip outputs a serial stream of data, which is buffered and placed (still in serial format) on the memory buss where it is recorded into memory. Whether during a play or record cycle, U11 reconstructs an analog signal from the serial digital data. The reconstructed signal is filtered first by a RC network in series (R19 and C12 in FIG. 7) to block DC, and then by C10 in FIG. 7 in parallel with ground to remove any crosstalk from the clocks or radio frequency signals.

Next, the reconstructed analog signal is low pass filtered by two MF6-50 6-pole digital filters, to remove any high frequency quantization noise that nay be present. The two filters are cascaded to form a 12-pole system. Since the filters are slaved to the filter clock, they have the same cutoff frequency as the input filters. Several RC filters are employed to filter out RF and crosstalk and provide DC bias before final ampliciation by U23 shown in FIG. 8, and the MF6-50 filters themselves have op-amps on board the chips themselves that are used to provide the proper impedance for the filters. R42 in FIG. 8 is a variable resistor that controls the signal strength of the output. The amplifier is a LM386 hi-fidelity audio amplifier with a gain of 20 (approximately 13dB). This produces a 0.5 watt 8 Ohm unbalanced output that may be monitored by a jack on the front panel, fed to a speaker through pin 6 of J2 in Table 3, or fed to an amplifier through pin 5 of J2.

Timing for logic board 22 is provided by dividing down the filter clock. The first digital filter, U1 shown in FIG. 5, generates the filter clock from an on-board RC oscillator. This filter clock is divided by eight by U2 (a divide by n counter) to produce the data clock, which is used by U11 (FIG. 8) to sample the audio. Since CVSD encoding produces one bit per sample, the data clock and the serial data stream produced by U11 are at the same frequency. A delayed version of the data clock (memory buss pin 11 in Table 1) is fed to memory buss 28 for the serial to parallel converter. The delay is necessary for the data to become stable before they are shifted. An advanced version of the data clock (memory buss pin 13) is also used in a similar manner to shift data in the parallel to serial process. The data clock is divided by eight by U4 (a divide by eight counter shown in FIG. 4) to produce the address clock. This clock is divided by the address clocks on the memory boards 26 to produce the address for the memory chips, and it is used to strobe the serial to parallel and parallel to serial converters. The basic idea is that in one pulse of the address clock, eight bits of serial data are transmitted, hence another memory location is needed.

Figures 1, 10:
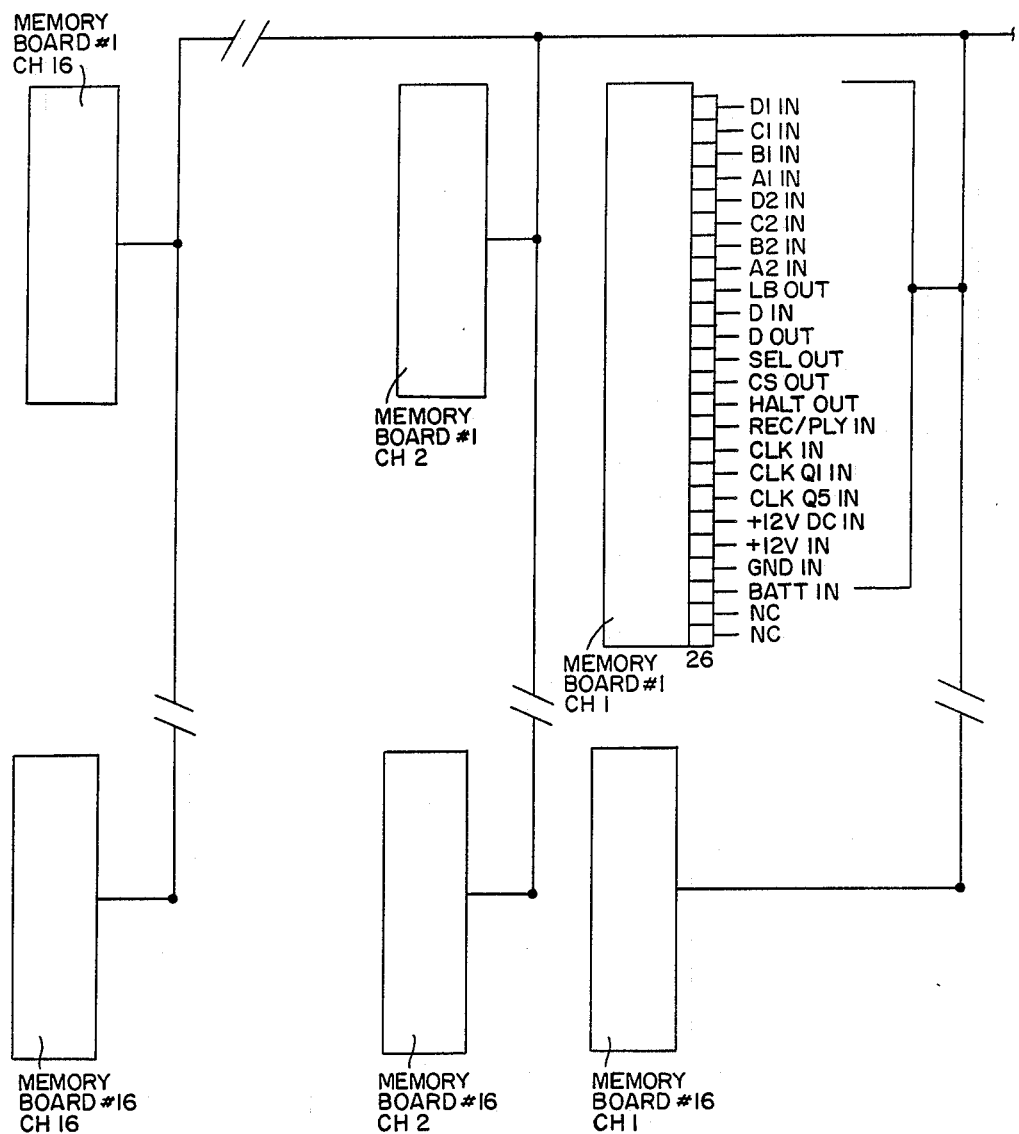
FIG. 10 is a diagram showing the external control unit for the memory boards of the present invention.
Figures 2, 10:
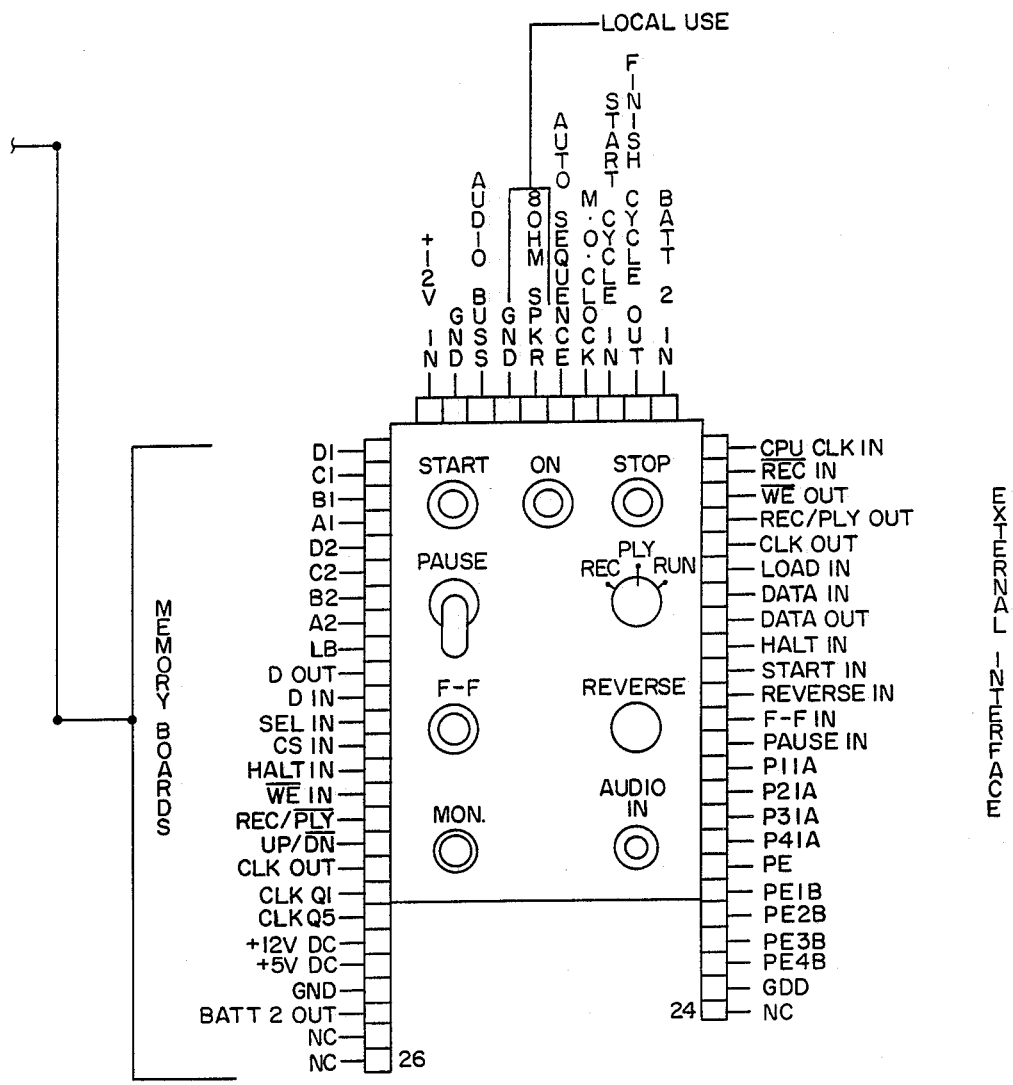

The special features (fast forward, reverse, and pause) are created by manipulating the clock. By pressing the fast forward button F-F, shown in FIG. 10, on the face of the logic board 22, U2 is changed from a divide by eight to a divide by four counter, thus making the system twice as fast. U4 is a switch that controls U2. The reverse switch also changes U2 into a divide by four counter, but also pulls the up/down control line (pin 17 on memory buss 28) low which causes the board, channel and address counters to count backwards. The module reverses at a rate two times faster than normal play. The pause function is realized by disabling the clock. By flipping the pause switch, U7 in FIG. 5, a quad nand, the filter clock is cut off from U2, U3, (the dividers which are cascaded to produce the data and memory clocks) and U11 (the CVSD encoder), thus stopping the system. The pause function intended as an editing tool.

Logic board 22 is controlled by a "D" flip-flop. U6 shown in FIG. 4 contains the "D" flip-flop and is the heart of logic board 22. When power is first applied to the board, a power-on-reset circuit generates a momentary pulse which resets the board and channel counters, (U24 and U25 in FIG. 8) pulses the reset line, (memory buss pin 30) which resets the address counters on all the memory boards and resets the "D" flip-flop into the standby mode. The inverted output from the "D" flip-flop (Q bar) resets the frequency dividers U2 and U3. The noninverted output is pulled low, and is tied to the reset of the CVSD encoder (U11). This resets the internal integrators of the CVSD encoder. Since the CVSD encoder integrates the previous three samples to produce the reference waveform, this sets the proper DC bias for the audio signal.

The flip-flop stays in the reset state (standby mode) until the system starts recording or playing (to record or play, pushing the start push button sends a positive pulse to the clock input of the "D" flip flop). Since the "D" input is tied high, the flip-flop toggles to the set state (or the operate mode). Since Q is tied to the active low reset of the CVSD encoder, the CVSD encoder stops generating a quiet pattern and starts encoding the analog signal. The reset condition on the frequency dividers ends, and the recording or playing commences. Record differs only from play in that the CVSD encoder is toggled from encode to decode, and the memory chips write in the data instead of reading the data out. The record/play line in memory buss 28 (pin 7) communicates this information to memory boards 26.

Two playback modes are available. In the play mode, after a channel is played the recorder stops. The last board reset pulse from memory boards 26 sets both the board and channel counters to zero, and resets the flip-flop to the standby mode. The halt pulse from memory buss 28 (pin 21) just places the flip-flop into the standby mode, but does not affect the channel and board counters.

In the run mode, the reset line to the flip-flop is grounded, so logic board 22 ignores the signal from the halt or last board reset lines. (Memory pins 21 and 25). However, the last board pulse is still allowed to reset the board and channel counters back to zero. Because the flip-flop is still in operate mode, the channel is sequentially played over again. This feature is intended for continuous play applications. Since the memory board select pulse (edge pin 19) increments the board counter, and the channel counter is cascaded from the board counter (the carry out of the board counter, a 16 bit counter, is fed into the carry in of the channel counter, also a 16 bit counter) all 256 possible memory boards 32 in 16 channels could possibly be played. The first channel (starting with channel zero) must be completely filled with 16 memory boards 26 before any additional memory boards 26 are assigned to the next channel. When a channel is played, only the board counter is incremented, the channel counter is only reset. The only way to increment the channel counter is to let the board counter be incremented 16 times. Thus, for continuous play in run mode, channel zero must first be completely filled with 16 boards, then channel one then two and so on. In one configuration, only one logic board 22 and from one to 256 memory boards 26 could be used. All 256 boards (in 16 channels) could be played sequentially starting with channel zero. All 256 boards and 16 channels could be used, but only in a serial manner since the counters U24 and U26 reset to zero after the last board pulse.

In order for more than one channel to be addressed in a random access fashion, the J2 computer port shown in Table 3 on logic board 22 must be used. The preferred channel and board address number can be entered into the board and channel counters through the J2 port. It must be done each time a channel 30 is to be played, since the board and channel counters automatically reset to channel zero and board zero. Also included in port J2 is an input for an external clock, inputs to exchange data in the digital form, inputs to start a play or record sequence an inputs to control the special features (such as fast-forward, reverse and pause). For manual or automatic control, a manual control board is interfaced to this port to randomly play individual channels or individual boards.

Figures 1, 11:
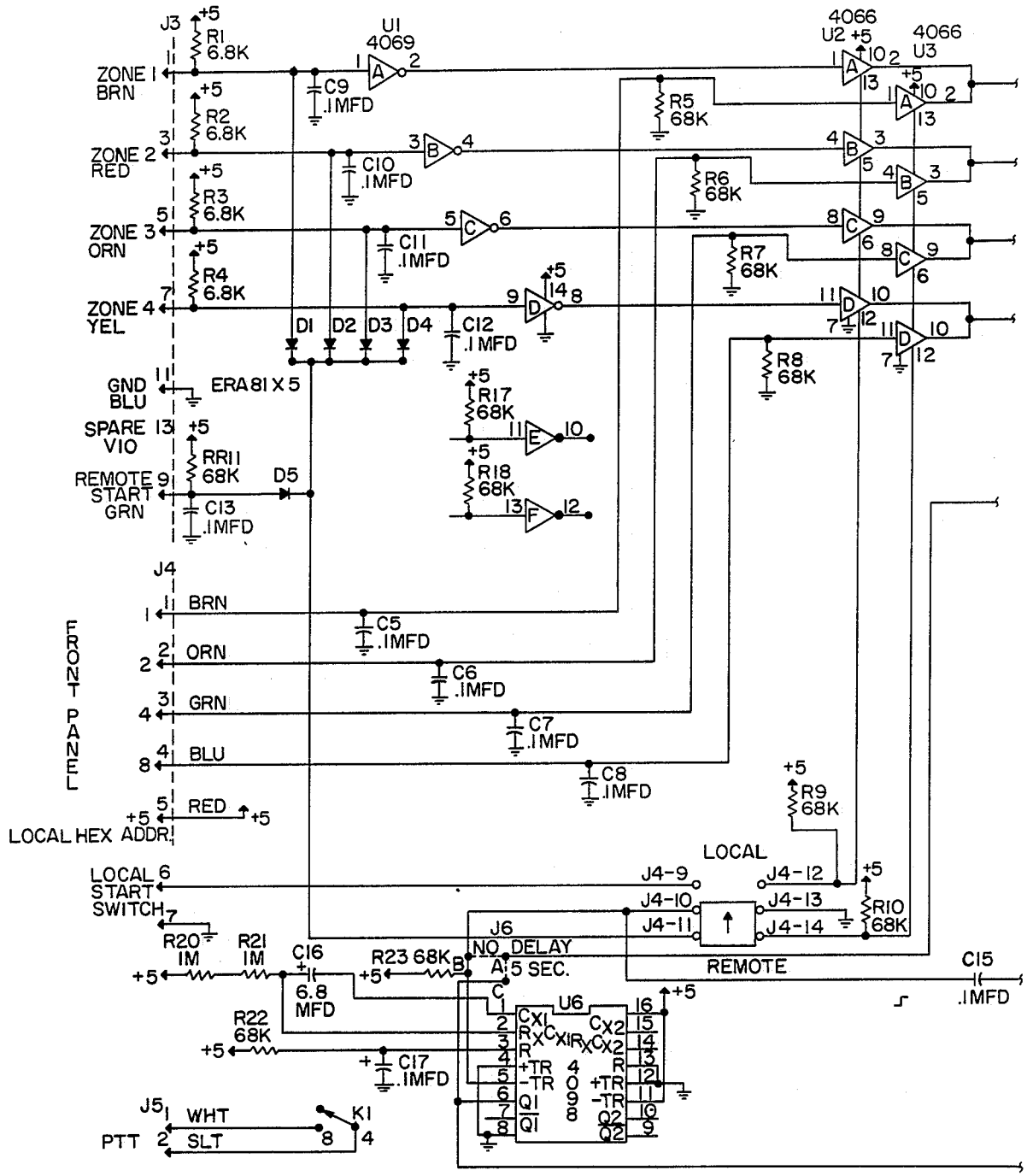
FIG. 11 is a schematic diagram showing the external control circuit of the present invention.
Figures 2, 11:
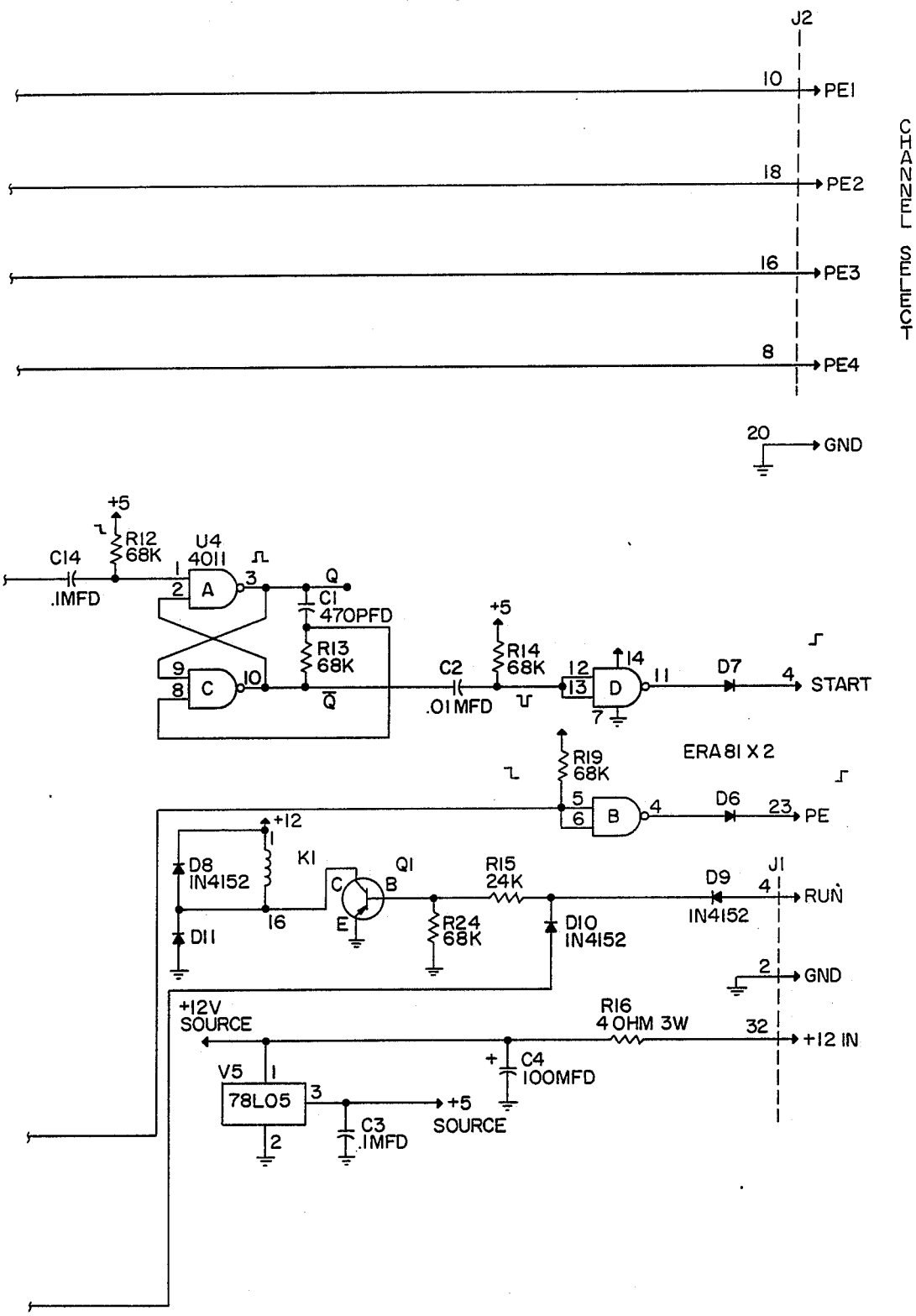

As shown in FIG. 1, external control computer port 23 is the interface between logic board 22 and the user. An example of how this port could be used is shown in FIG. 11. Referring to FIG. 11, the method of control is determined by a manual/auto switch on the face of the board. When set to manual, the buffers corresponding to the local (16 position hexadecimal) switch are enabled and the buffers from the automatic control port (J3 of FIG. 11) are disabled. The channel selected by the user appears at the J2 port of logic board 23. The selected channel is started by pressing the local start switch, which strobes the channel four bit code into the channel counter 19, and a pulse generator pulses the external start pin of J2, thus starting the play or record sequence. Both the channel and board numbers may be jammed into the J2 port to create 256 different random accessible messages.

When the automatic control is to be used, the manual/auto switch (FIG. 11) is set to auto, thus disabling the buffers connecting the local hexadecimal switch, and enabling the buffers connecting the inverted channel inputs of port J3 to the J2 port going to logic board 23. A programmable timer or remote control can be connected to J3, which will trigger logic board 22 to play a certain channel at a certain time. Inputs of +5 normally reside at J3, and the system is triggered by grounding any input to J3. The channel number is strobed into logic board 22 by a falling edge triggered device hooked up across all the channel inputs of J3. The start sequence is triggered by the falling edge of any input across J3, but delayed 28 microseconds to allow the channel number to become stable. For this reason channel zero (0000 in hexadecimal) cannot be used with automatic control, for it presents no falling edge from its binary representation. A grounded input is interpreted a logic high through the J3 port. Therefore, only the 15 remaining channels can be addressed remotely through the J3 port.

If a delay is needed for an external public address system hooked up to logic board 22 to warm up, a switch (J6) enables a monostable multivibrator which delays the start pulse for about five seconds.

As shown in FIG. 12, the variable length control allows a user to load any length message in memory, with the logic setting the stop code without the user having to manually set the last board switch for each message. The variable length control counts the length of the message when recorded, and then pulses the last board out at the right time each time the message is played. With the variable length control, up to 256 boards can be recorded with the same, albeit very long, message. The variable length control is located on logic board 22, and it takes its clocking from the counter strobe (pin 23 on memory buss 28) generated from A10 on memory board 30 (FIG. 12).

When turned on, memory manager U22 pulls the CE bar line low enabling data to be written to the memory and resetting the counters. As the message is recorded, cascaded address counters U13, U14, U15, and U16 count the pulses of the counter strobe and use the count to provide addressing for memory. (Organized as 64k addresses with 1 bit of data per address). During a record cycle, all ones are written into memory. When finished recording, the user switches from record to play. The record/play line goes low, and the system keeps counting by writing in zeros (the stop code) into memory. A "D" flip flop logic circuit allows the address counters to increment two more times, then pulses the last board out line which resets the recorder and clears the address counters. This is to insure separation between the old and new messages.

While playing, the counter strobe is again counted by U13, U14, U15 and U16. The one bit of memory corresponding to each incremental length of message is monitored by the D flip-flop. When it changes from one to zero (signifying the end of the message) a pulse is generated by the last board out line which resets the board and channel counters on logic board 22, resets the address counters on the variable length control (FIG. 14), and places logic board 22 back in standby mode (depending whether logic board 22 is set to run or play mode).

The memory of the variable length control is independent of the memory used to store the digital representation of the audio signal. This feature is designed for use with a telephone interface. Because the user may be remote from the recorder-player of the present invention, the variable length control in affect sets the last board switch for the user. This allows a message of any length to be loaded remotely from the unit itself. Memory boards 26 must first be set to channel zero because the channel and board counters are reset after a last board out pulse.

Control of a module of the present invention may be by local control or by a system capable of controlling up to four modules. If only one channel is needed, then the controls on the face of logic board 22 are sufficient to control the module. If more than one channel is needed, then a manual external address board (FIG. 11) is necessary, or another device interfaced to the J2 port on logic board 23 to strobe in the desired channel is needed. Such a configuration is sufficient to control one logic board 22 with up to 16 channels. If more complex system is needed (several audio sources or an extremely long channel), up to four modules can be tied together in a single system by an audio output control.

Figures 1, 13:
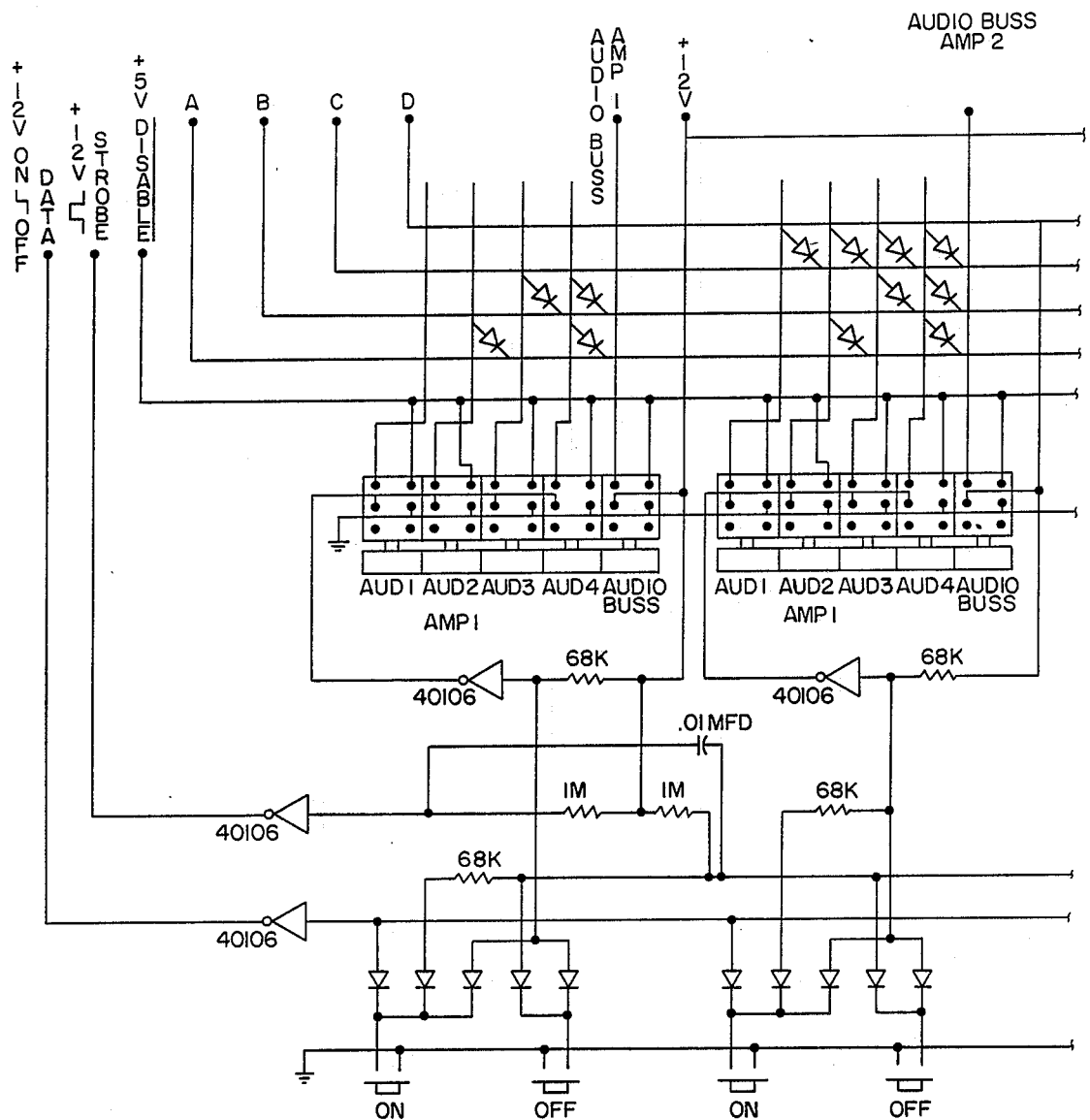
FIG. 13 is a schematic diagram of part of the audio output circuit of the present invention.
Figures 2, 13:
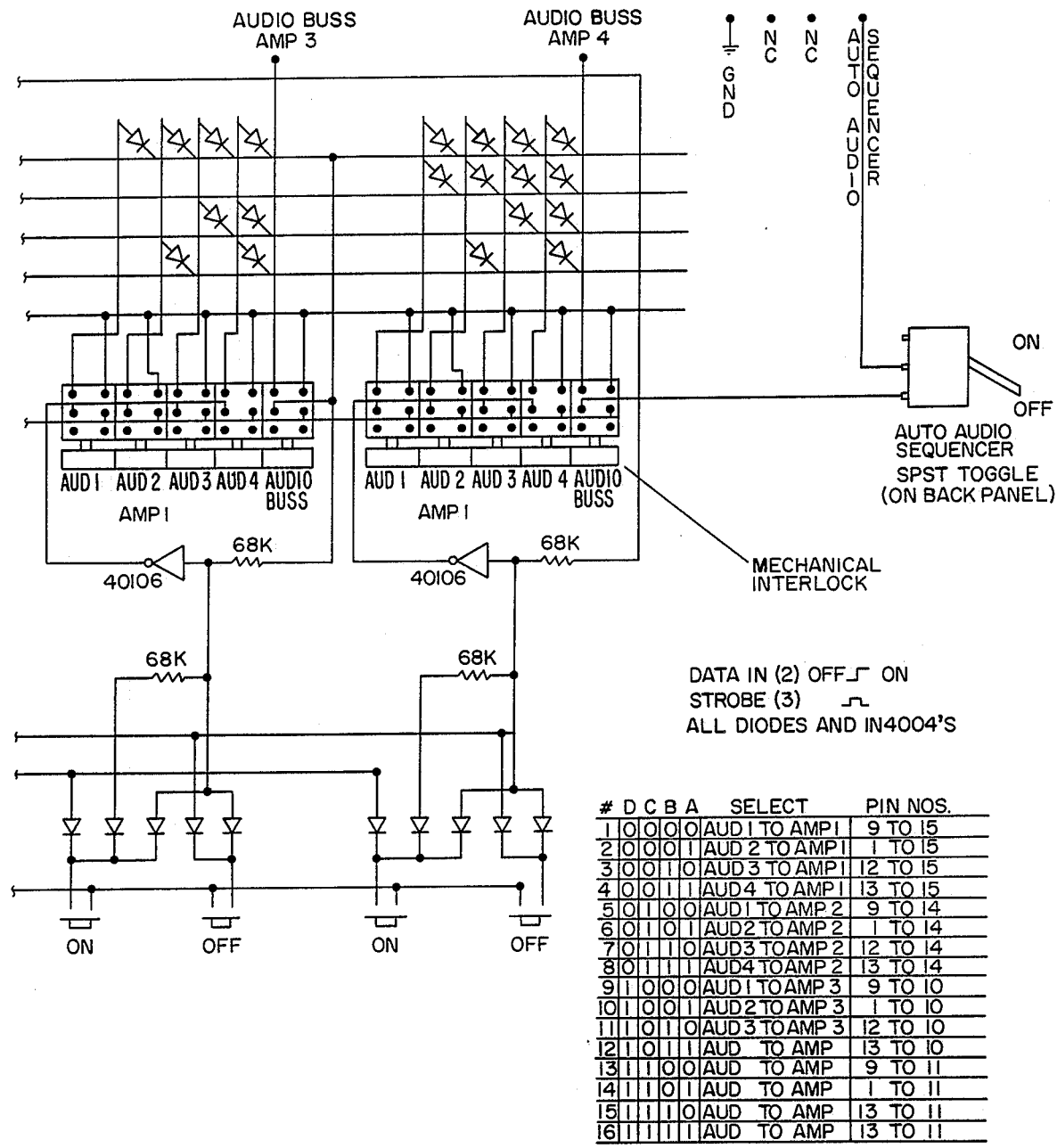
Figures 1, 14:
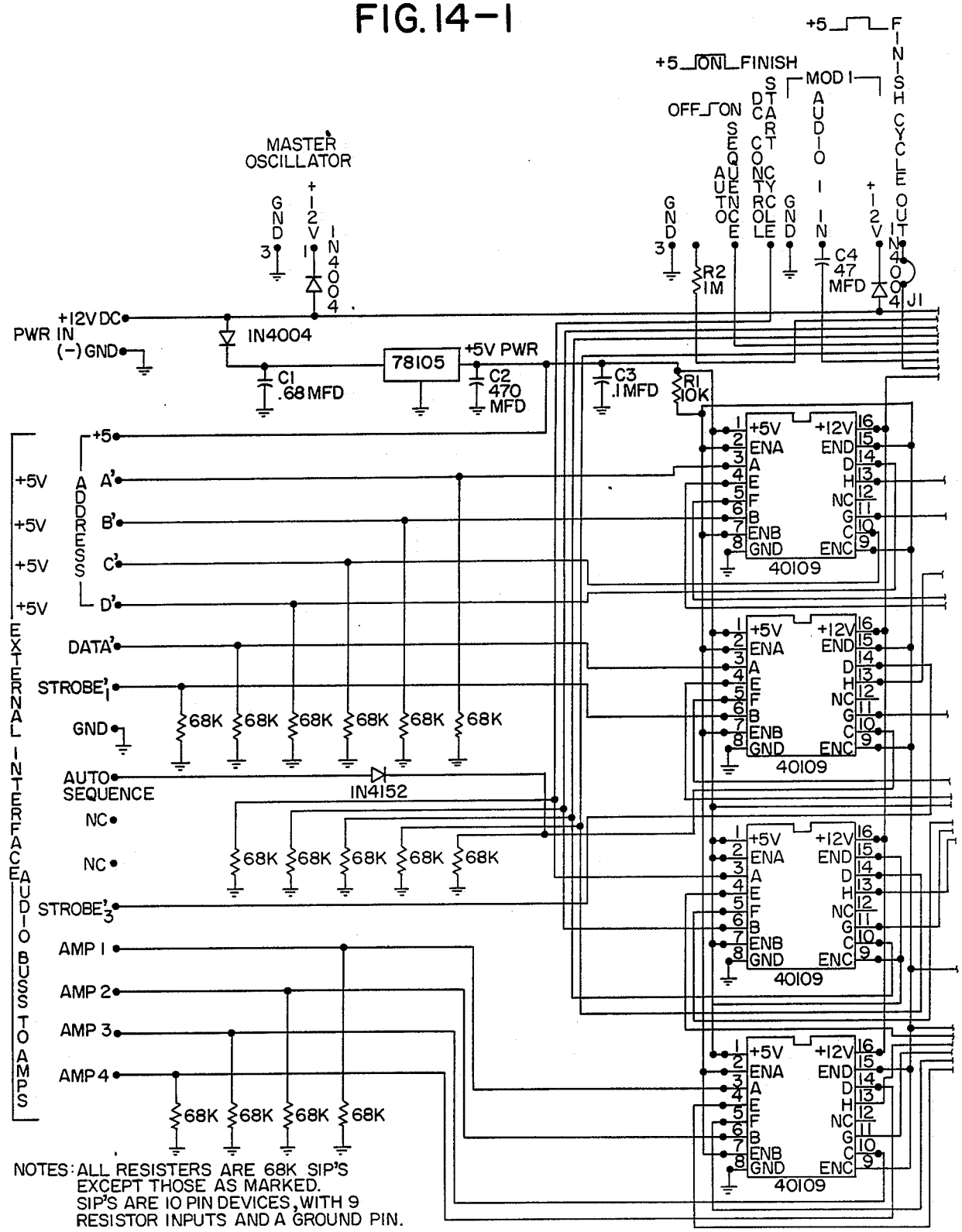
FIG. 14 is a schematic diagram of part of the audio output circuit of the present invention.
Figures 2, 14:
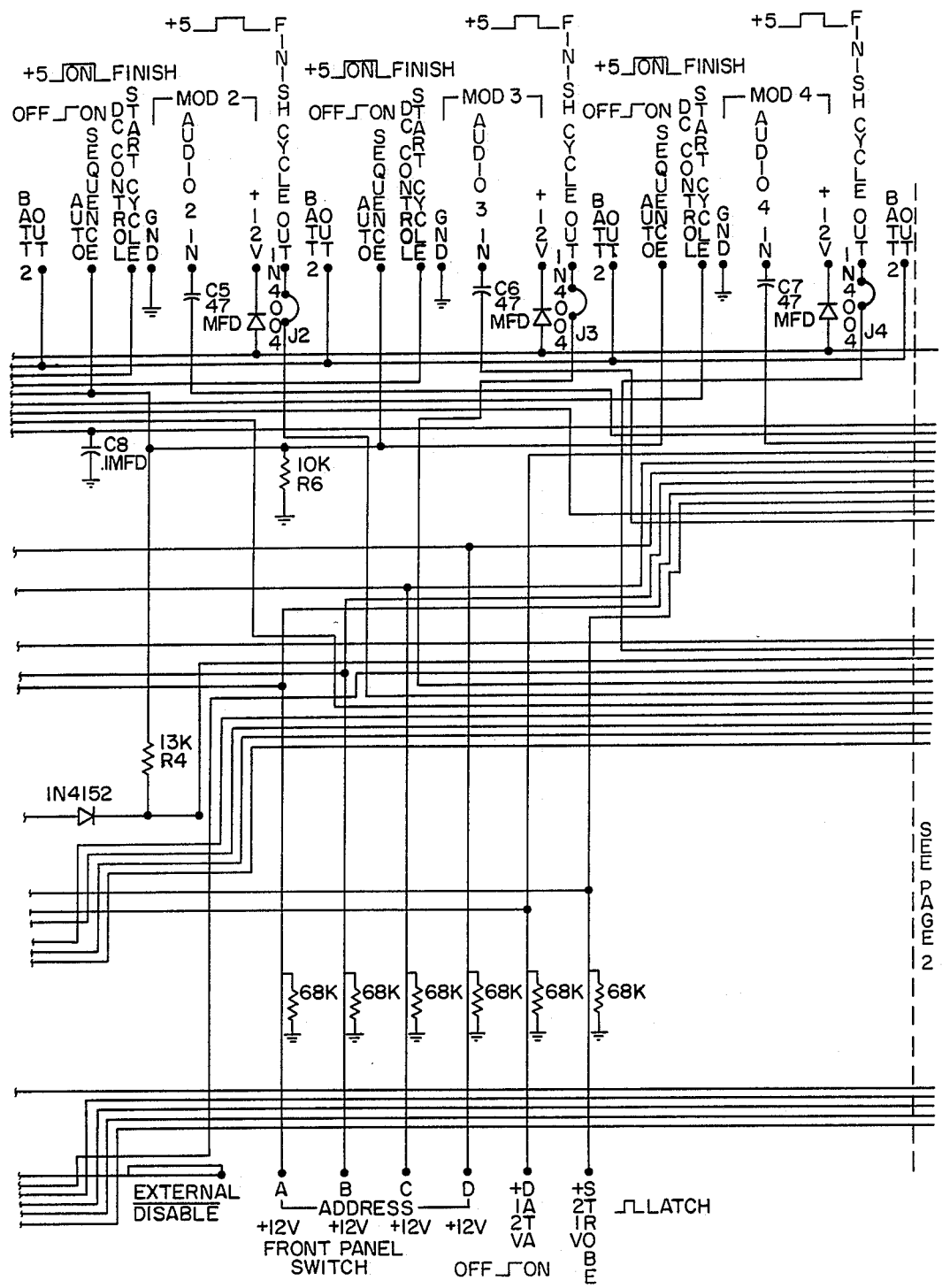
Figures 1, 15:
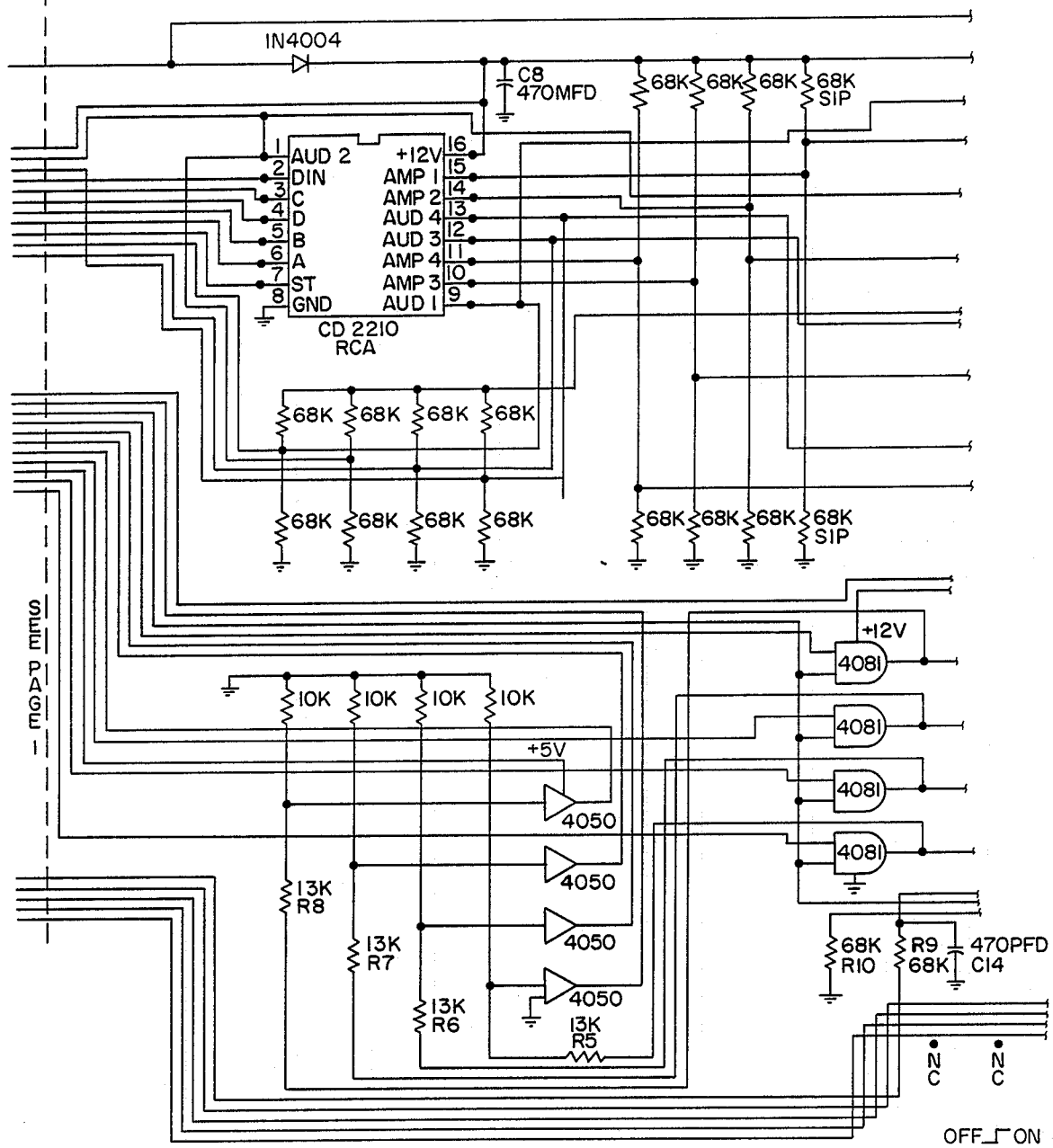
FIG. 15 is a schematic diagram of part of the audio output circuit of the present invention.
Figures 2, 15:
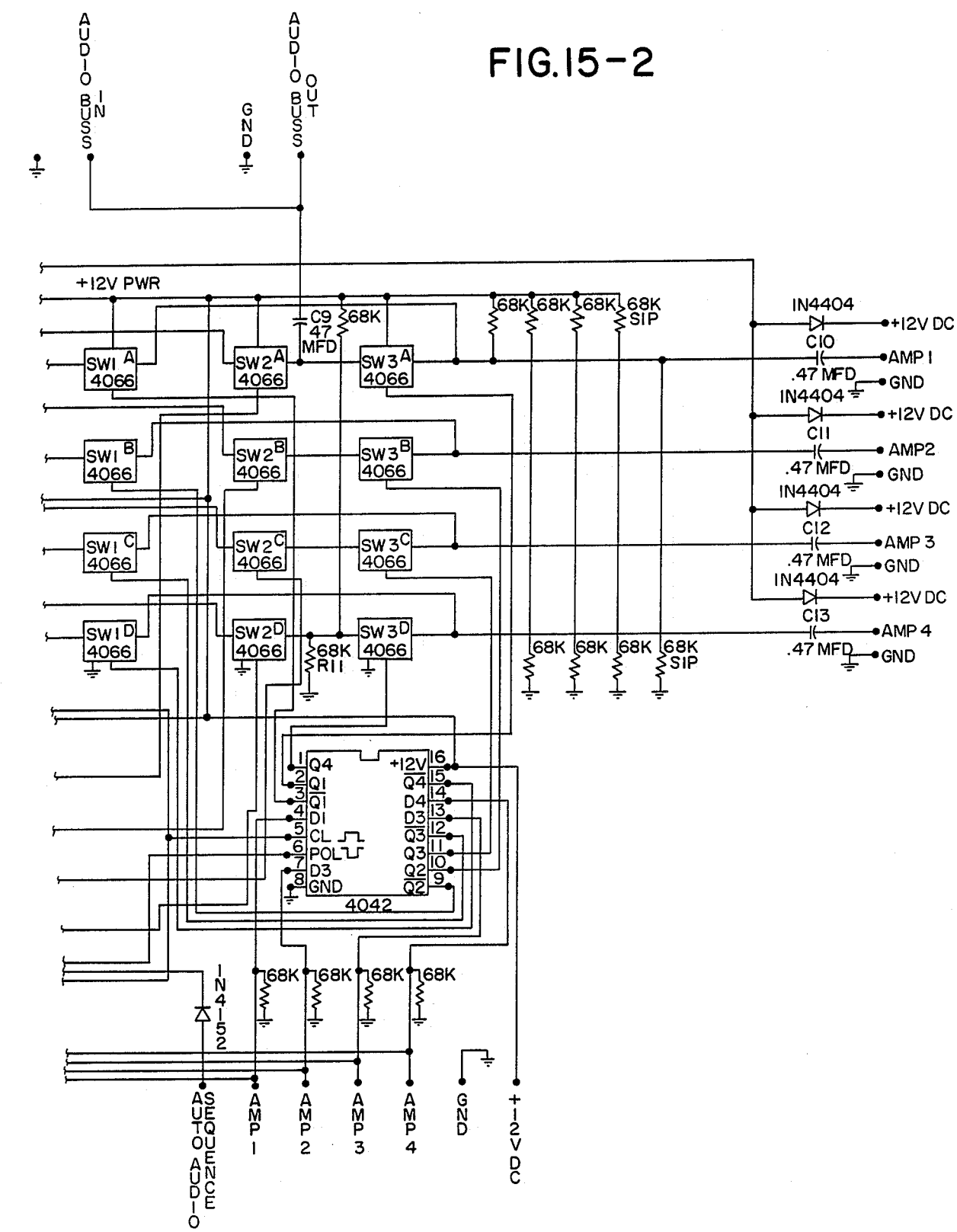

As shown in FIGS. 13, 14, and 15, the audio output control takes as its input audio from the four modules and has as outputs up to four separate amplifiers. It is basically a four by four crosspoint switch, allowing the user to send any audio input from any of four modules to one or all of the output amplifiers.

Preferably, designed to fit in a single enclosure, the system control combines the crosspoint switch, external interface, master oscillator, front panel switches, secondary battery backup power supply, and amplifiers for each output channel. On the front panel there are four groups of five switches each. One of the five switches enables the audio buss. When the button is depressed the logic high signal goes to a d-triggered flip-flop (4042 in FIG. 15) whose output then goes to an array of (4066) switches which connects the audio intended for that amplifier. The other four switches select which of the four audio source are connected to the intended output for that audio buss (audio 1 to amp 1, audio 2 to amp 1, audio 3 to amp 1, and audio 4 to amp 1, audio 1 to amp 2, audio 2 to amp 2, etc...audio 4 to amp 4) (FIG. 13).

Figures 1, 16:
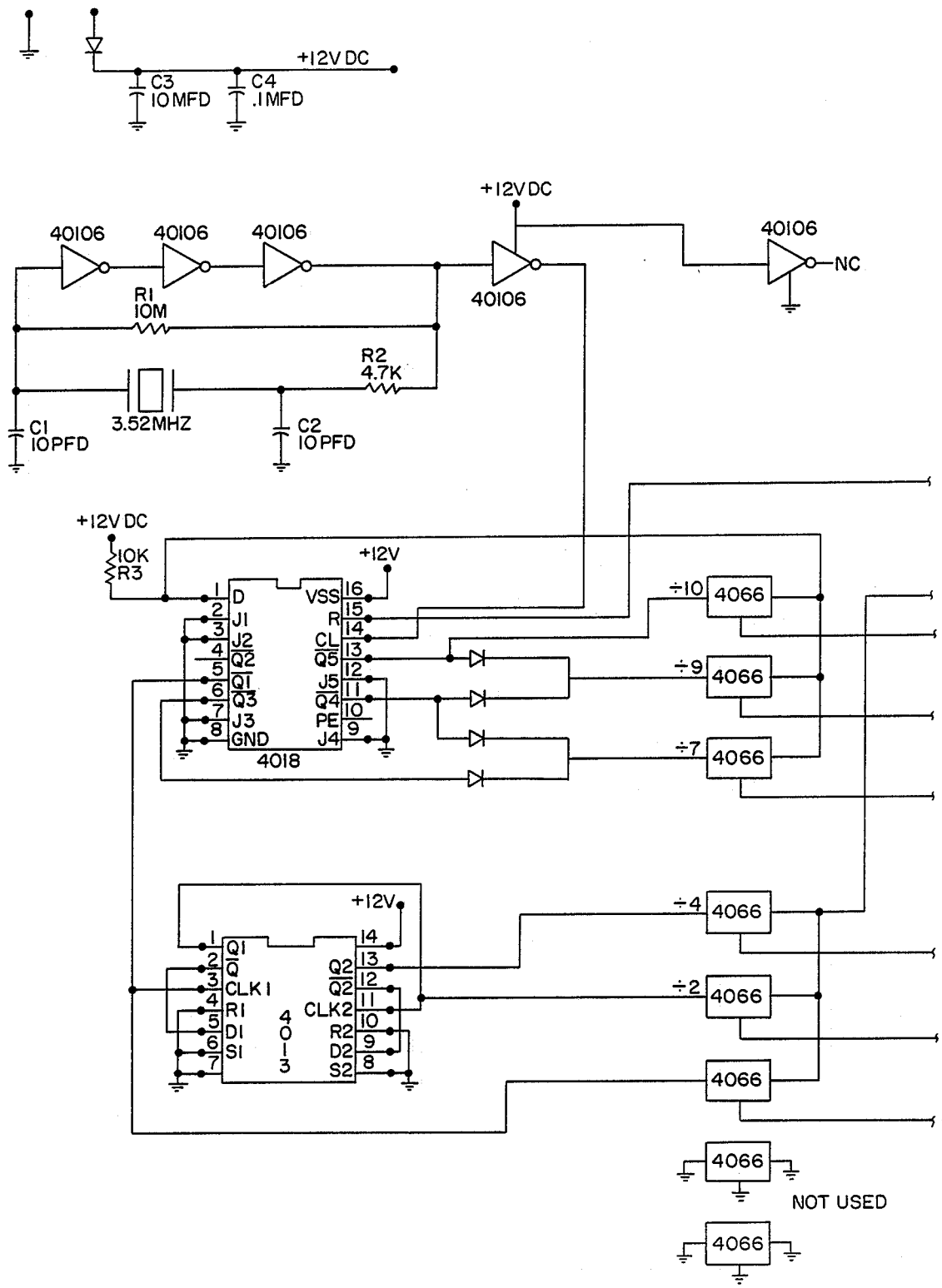
FIG. 16 is a schematic diagram of the master oscillator of the present invention.
Figures 2, 16:
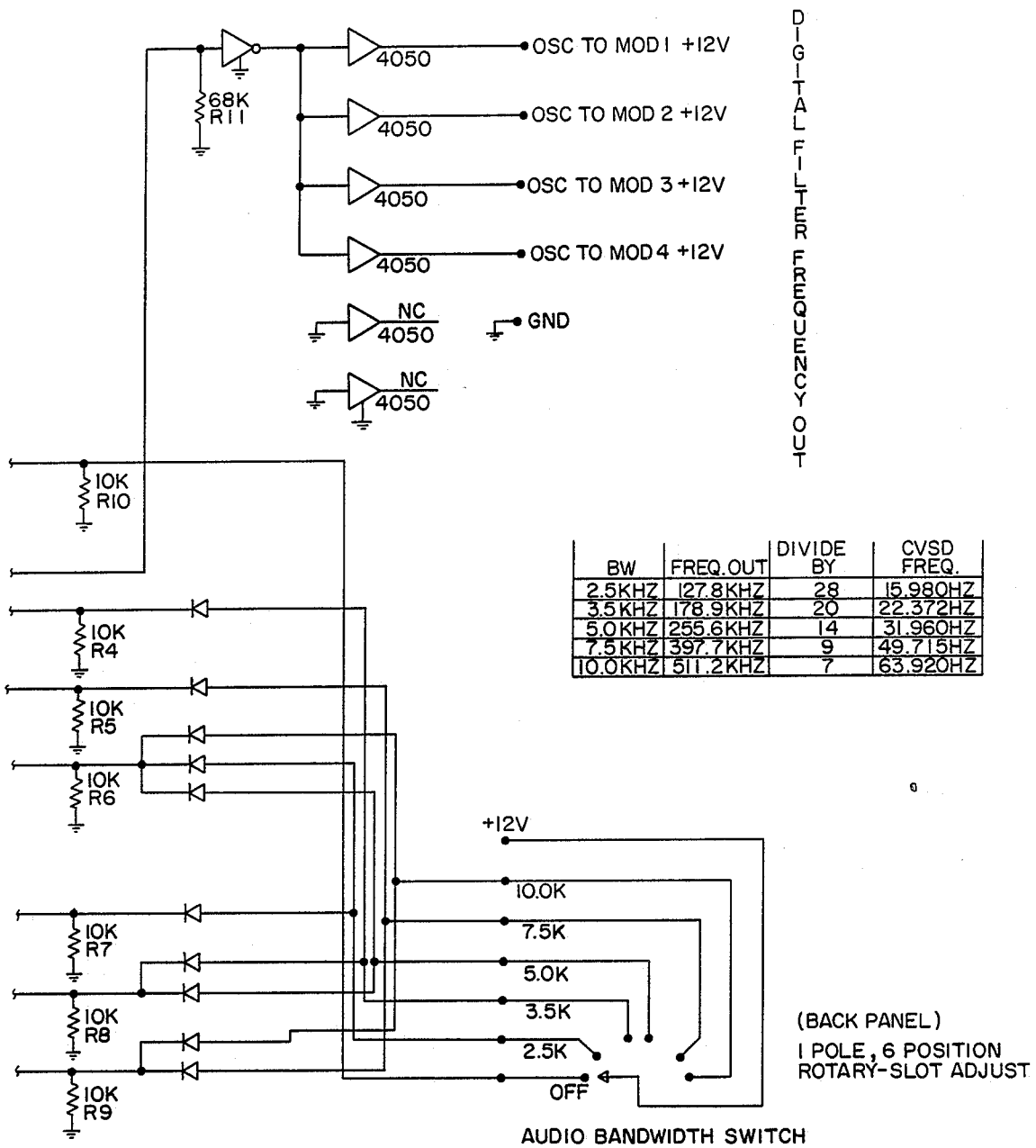

With reference to FIG. 16, a programmable 4 by 4 crosspoint switch (CD2210 in FIG. 15) is used to make the connection. More than one connection can be made at one time. For example, if the audio to amp one button is depressed and the on button is depressed this makes the connection from the first audio source to the first amplifier. Since there is no reset on the CD2210, an off button is provided. This breaks the connection pressed.

The module also contains a master oscillator clock (FIG. 16), to make sure that all the modules are operating at the same clock frequency and at the same bandwidth. When a single module is operating the clocking is provided by the first MF6-50 filter through an on-board RC oscillator. If two units are to be used in the same system, than a digital dump of data from one module to another is possible. For this to be effective, then the two systems must be sample at the same frequency. The master oscillator (FIG. 16) uses a crystal 3.58 MHz oscillator fed to an even frequency divider, with as array of diodes as described in DRI Pat. No. 4,772,873 to accomplish odd division. A rotary switch selects which combination of signals is fed back to vary the division rate. This signal is fed to the individual filters on each logic board. Since the sampling frequency is divided off the filter frequency, the modules in the system have exactly the same sampling frequency. The user can select the bandwidth of the whole system form 2.5, 3.5, 5, 7.5, and 10 thousand Hertz by a simple switch.

Although the present invention has been described in reference to a specific preferred embodiment, the invention is not limited to the specific example given and other embodiments and modifications will be apparent to those skilled in the art without departing from the spirit and scope of the invention.

What is claimed is:

1. A multi-channel digital random access recorder-player comprising:
   an analog filter for receiving and filtering an analog signal to produce an analog filter output signal;
   a digital filter for digitally filtering said analog filter output signal to produce a digital filter output signal;
   an analog to digital converter coupled to said digital filter for converting said digital filter output signal to a digital signal;
   logic control means coupled to said analog to digital converter for controlling said recorder-player;
   clocking means coupled to said logic control means for generating at least one clocking frequency signal;
   memory means coupled to said logic control means having a plurality of channels, each of said channels having a plurality of memory boards for storing data;
   addressing means coupled to said memory means for assigning a unique binary address to each of said channels and to each of said memory boards of said memory means;

external control means coupled to said logic control means for selecting one of a record mode and a playback mode of operation for said recorder-player and for selecting binary address corresponding to a selected one of said binary addresses of said channels and for selecting a binary address corresponding to a selected one of said binary addresses of said memory boards;

comparator means for comparing said binary address selected by said external control means with each one of said binary addresses of said channels and with each one of said binary addresses of said memory boards, such that the one of said binary addresses of said channels corresponding to said binary address of said channel selected by said external control is detected and such that the one of said binary addresses of said memory boards corresponding to said binary address of said memory board selected by said external control is detected; and memory enabling means coupled to said memory means and to said logic control means for enabling said channel and said memory board having said addresses corresponding to said addresses of said channel and said memory board selected by said external control, such that data from said logic control is recorded in said enabled channel and memory board when said external control means selects said record mode of operation.

2. The multi-channel digital random access recorder-player of claim 1 wherein said memory means is a solid state memory.

3. The multi-channel digital random access recorder-player of claim 2 wherein said solid state memory is CMOS memory.

4. The multi-channel digital random access recorder-player of claim 1 wherein said memory means includes sixteen channels, each of said channels including sixteen memory boards.

5. The multi-channel digital random access recorder-player of claim 1 wherein said analog to digital converter includes a continuous variable slope delta modulator.

6. The multi-channel digital random access recorder-player of claim 1 wherein said memory means is coupled to said logic control means by a memory buss, said memory buss including a 34 pin edge connector.

7. A multi-channel digital random access recorder-player comprising:

an analog filter for receiving and filtering an analog signal to produce an analog filter output signal;

a digital filter for digitally filtering said analog filter output signal to produce a digital filter output signal;

an analog to digital converter coupled to said digital filter for converting said digital filter output signal to a digital signal;

logic control means coupled to said analog to digital converter;

clocking means coupled to said logic control means for generating at least one clocking frequency signal;

memory means coupled to said logic control means having a plurality of channels, each of said channels having a plurality of memory boards for storing data;

addressing means coupled to said memory means for assigning a unique binary address to each of said channels and to each of said memory boards of said memory means;

external control means coupled to said logic control means for selecting one of a record mode and a playback mode of operation for said recorder-player and for selecting a binary address corresponding to a selected one of said binary addresses of said channels and for selecting a binary address corresponding to a selected one of said binary addresses of said memory boards;

comparator means for comparing said binary address selected by said external control means with each one of said binary addresses of said channels and with each one of said binary addresses of said memory boards, such that the one of said binary addresses of said channels corresponding to said binary address of said channel selected by said external control is detected and such that the on of said binary addresses of said memory boards corresponding to said binary address of said memory board selected by said external control is detected;

audio output means coupled to said analog filter;

digital to analog converter coupled to said logic control means and to said audio output means; and memory enabling means coupled to said memory means and to said logic control means for enabling said channel and said memory board having said address corresponding to said addresses of said channel and said memory board selected by said external control, such that data from said logic control is retrieved from said enabled channel and memory board and transmitted to said audio output means when said external control means selects said playback mode of operation.

8. The multi-channel digital random access recorder-player of claim 7 wherein said memory means is a solid state memory.

9. The multi-channel digital random access recorder-player of claim 8 wherein said solid state memory is CMOS memory.

10. The multi-channel digital random access recorder-player of claim 7 wherein said memory means includes sixteen channels, each of said channels including sixteen memory boards.

11. The multi-channel digital random access recorder-player of claim 7 wherein said analog to digital converter includes a continuous variable slope delta modulator.

12. The multi-channel digital random access recorder-player of claim 7 wherein said digital to analog converter includes a continuous variable slope delta modulator.

13. The multi-channel digital random access recorder-player of claim 7 wherein said memory means is coupled to said logic control means by a memory buss, said memory buss including a 34 pin edge connector.

14. The multi-channel digital random access recorder-player comprising:

a plurality of interconnected random access modules, each of said modules including:

an analog filter for receiving and filtering an analog signal to produce an analog filter output signal;

a digital filter for digitally filtering said analog filter output signal to produce a digital filter output signal;

an analog to digital converter coupled to said digital filter output signal for converting said digital filter output signal to a digital signal;

clocking means coupled to said digital filter for generating at least one clocking frequency signal;

logic control means coupled to said analog to digital converter for controlling said recorder-player;

memory means coupled to said logic control means having a plurality of channels, each of said channels having a plurality of memory boards for storing data;

addressing means coupled to said memory means for assigning a unique binary address to each of said channels and to each of said memory boards of said memory means;

external control means coupled to at least one of said logic control means for selecting one of a record mode and a playback mode of operation for said recorder-player and for selecting a binary address corresponding to a selected one of said binary addresses of said channels and for selecting a binary address corresponding to selected one of said binary addresses of said memory boards;

comparator means for comparing said binary address selected by said external control means with each one of said binary addresses of said channels and with each one of said binary addresses of said memory boards, such that the one of said binary addresses of said channels corresponding to said binary address of said channel selected by said external control is detected and such that the one of said binary addresses of said memory boards corresponding to said binary address of said memory board selected by said external control is detected; and memory enabling means coupled to said memory means and to said logic control means for enabling said channel and said memory board having said addresses corresponding to said addresses of said channel and said memory board selected by said external control, such that data from said logic control is recorded in said enabled channel and memory board when said external control means selects said record mode of operation.

15. The multi-channel digital random access recorder-player of claim 14 wherein each of said memory means is coupled to one of said logic control means by a memory buss, said memory buss including a 34 pin edge connector.

16. A multi-channel digital random access recorder-player comprising:

a plurality of interconnected random access modules, each of said modules including:

an analog filter for receiving and filtering an analog signal to produce an analog filter output signal;

a digital filter for digitally filtering said analog filter output signal to produce a digital filter output signal;

an analog to digital converter coupled to said digital filter output signal for converting said digital filter output signal to a digital signal;

clocking means coupled to said digital filter for generating at least one clocking frequency signal;

logic control means coupled to said analog to digital converter for controlling said recorder-player;

memory means coupled to said logic control means having a plurality of channels, each of said channels having a plurality of memory boards for storing data;

addressing means coupled to said memory means for assigning a unique binary address to each of said channels and to each of said memory boards of said memory means;

external control means coupled to at least one of said logic control means for selecting one of a record mode and a playback mode of operation for said recorder-player and for selecting a binary address corresponding to a selected one of said binary addresses of said channels and for selecting a binary address corresponding to a selected one of said binary addresses of said memory boards;

comparator means for comparing said binary address selected by said external control means with each one of said binary addresses of said channels and with each on of said binary addressees of said memory boards, such that the one of said binary addresses of said channels corresponding to said binary address of said channel selected by said external control is detected and such that the one of said binary addresses of said memory boards corresponding to said binary address of said memory board selected by said external control is detected;

audio output means;

digital to analog converter coupled to said logic control means and to said audio output means; and memory enabling means coupled to said memory means and to said logic control means for enabling said channel and said memory board having said addresses corresponding to said addresses of said channel and said memory board selected by said external control, such that data form said logic control is retrieved from said enabled channel and memory board when said external control means selects said playback mode of operation.

17. The multi-channel digital random access recorder-player of claim 16 wherein said memory means is coupled to said one of said logic control means by a memory buss, said memory buss including a 34 pin edge connector.

* * * * *